(12) United States Patent
Kang

(10) Patent No.: US 6,842,387 B2
(45) Date of Patent: Jan. 11, 2005

(54) METHOD AND CIRCUIT FOR REPAIRING NONVOLATILE FERROELECTRIC MEMORY DEVICE

(75) Inventor: Hee Bok Kang, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/339,458

(22) Filed: Jan. 10, 2003

(65) Prior Publication Data

US 2003/0156475 A1 Aug. 21, 2003

(30) Foreign Application Priority Data

Feb. 21, 2002 (KR) .............................. 10-2002-0009241

(51) Int. Cl.⁷ ................................................ G11C 7/00
(52) U.S. Cl. ...................................... 365/200; 365/145
(58) Field of Search ............................... 365/200, 145, 365/198.05

(56) References Cited

U.S. PATENT DOCUMENTS

| | | |
|---|---|---|
| 5,991,225 A | 11/1999 | Forbes et al. |
| 6,006,313 A | 12/1999 | Fukumoto |
| 6,034,882 A | 3/2000 | Johnson et al. |
| 6,134,160 A | 10/2000 | Waller et al. |
| 6,205,064 B1 | 3/2001 | Ooishi |
| 6,597,608 B2 * | 7/2003 | Kang et al. ................. 365/200 |
| 2003/0053328 A1 * | 3/2003 | Park et al. ................. 365/145 |

* cited by examiner

Primary Examiner—Huan Hoang
(74) Attorney, Agent, or Firm—Birch, Stewart, Kolasch & Birch, LLP

(57) ABSTRACT

Disclosed is a method and circuit for repairing a nonvolatile ferroelectric memory device that can control the redundancy operation according to a user's program setting. In the repairing method, fail addresses are stored in a plurality of redundancy coding cells of a redundancy coding section composed of a ferroelectric capacitor, a redundancy master cell and the redundancy coding cells, and if input addresses satisfy conditions encrypted by a user, a master signal is activated through the redundancy master cell by outputting to the redundancy coding section a set signal, a reset signal and a first group of control signals. If the input addresses correspond to the fail addresses stored in the redundancy coding cells, a second group of control signals are outputted by performing a logical operation of the master signal, and then a third group of control signals are outputted for inactivating normal input/output paths and activating redundancy input/output paths by operation of a redundancy control section which receives the second group of control signals as its inputs.

34 Claims, 27 Drawing Sheets

METHOD AND CIRCUIT FOR REPAIRING NONVOLATILE FERROELECTRIC MEMORY DEVICE

This application claims the benefit of the Korean Application No. P 2002-9241 filed on Feb. 21, 2002, which is hereby incorporated by reference.

BACKGROUND OF THE INVENTION

1. Field of the Invention

The present invention relates to a semiconductor device, and more particularly, to a method and circuit for repairing a nonvolatile ferroelectric memory device that enables a user to control a redundancy operation of the memory device in accordance with an encrypted condition.

2. Discussion of the Related Art

Generally, a nonvolatile ferroelectric memory, i.e., a ferroelectric random access memory (FeRAM), becomes the center of attention as the next-generation memory device since it has a data processing speed of the dynamic random access memory (DRAM) grade and preserves stored data even if the power is off.

The FeRAM is a memory device having a similar structure to the DRAM, and uses a high residual dielectric polarization that is the characteristic of a ferroelectric material that is used as a material of a capacitor in the memory device.

Due to the characteristic of the residual dielectric polarization, the data stored in the memory device is not erased even if an applied electric field is removed.

FIG. 1 is a characteristic diagram illustrating the hysteresis loop of a general ferroelectric material.

As shown in FIG. 1, even though the electric field is removed, the polarization induced by the electric field does not vanish due to the existence of the residual dielectric polarization (or spontaneous polarization), but is kept a specified amount (i.e., states d and a).

In the nonvolatile ferroelectric memory cell, the states d and a can correspond to 1 and 0, respectively, and this characteristic enables the cell to be used as a memory device.

Hereinafter, the conventional nonvolatile ferroelectric memory device will be explained with reference to the accompanying drawings.

FIG. 2 is a view illustrating the construction of a unit cell of the conventional nonvolatile ferroelectric memory device.

As shown in FIG. 2, the unit cell of the conventional nonvolatile ferroelectric memory cell includes a bit line B/L formed in one direction, a word line W/L formed in a direction crossing the bit line B/L, a plate line P/L formed in the same direction as the word line W/L at a specified distance from the word line W/L, a transistor T whose gate is connected to the word line W/L and whose source is connected to the bit line B/L, and a ferroelectric capacitor FC whose first terminal is connected to a drain of the transistor T and whose second terminal is connected to the plate line P/L.

The conventional method of repairing a nonvolatile ferroelectric memory device will now be explained with reference to the accompanying drawings.

FIG. 3 is a view illustrating the conventional rapair algorithm of a nonvolatile ferroelectric memory device.

As illustrated in FIG. 3, after the whole process is completed, a chip test is performed through proceeding of a full address memory test (3a) and a fail address analysis step (3b) for finding a fail address.

Then, if it is possible to relieve the fail address as analyzed above by a relieving circuit, a relief fuse block performs a fuse cutting in the form of a fuse capable of coding the corresponding address using a laser beam (3c).

If the corresponding fail address is inputted after completion of the fuse cutting, an active signal is generated from the relieving circuit to activate the relief cell.

Meanwhile, a main cell corresponding to the address is inactivated by an inactive signal of the relieving circuit.

Accordingly, the main cell of the corresponding fail address is inactivated, and the relief cell is activated.

However, the conventional method of repairing a nonvolatile ferroelectric memory device as described above has the following problems.

First, since the fuse cutting is performed using the laser, the repair becomes impossible if the fail is produced after a packaging process, and this causes the fail to be increased to deteriorate the quality of a product.

Second, since expensive laser equipment should be provided, the manufacturing cost of the device is increased.

SUMMARY OF THE INVENTION

Accordingly, the present invention is directed to a method and circuit for repairing a nonvolatile ferroelectric memory device that substantially obviates one or more problems due to limitations and disadvantages of the related art.

An object of the present invention is to provide a method and circuit for repairing a nonvolatile ferroelectric memory device that can control the redundancy operation according to a user's program setting (i.e., encryption), and repair the memory device even if a fail is produced during a memory test or after completion of packaging by enabling a redundancy coding using the characteristic of a ferroelectric material without a fuse cutting process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of repairing a nonvolatile ferroelectric memory device includes the steps of storing fail addresses in a plurality of redundancy coding cells of a redundancy coding section composed of a ferroelectric capacitor, a redundancy master cell and the redundancy coding cells, if input addresses satisfy conditions encrypted by a user, activating a master signal through the redundancy master cell by outputting to the redundancy coding section a set signal, a reset signal and a first group of control signals, if the input addresses correspond to the fail addresses stored in the redundancy coding cells, outputting a second group of control signals by performing a logical operation of the master signal, and outputting a third group of control signals for inactivating normal input/output paths and activating redundancy input/output paths by operation of a redundancy control section which receives the second group of control signals as its inputs.

In another aspect of the present invention, a method of repairing a nonvolatile ferroelectric memory device in a fail row address relieving method, includes the steps of storing fail row addresses in a plurality of redundancy coding cells of a redundancy coding section composed of a ferroelectric capacitor, a redundancy master cell and the redundancy coding cells, if input row addresses satisfy conditions encrypted by a user, activating a master signal through the redundancy master cell by outputting to the redundancy coding section a set signal, a reset signal and first to sixth control signals ENN, ENP, EQN<, CPL, ENW<n> and PREC, if the input row addresses correspond to the fail row addresses stored in the redundancy coding cells, outputting seventh and eighth control signals REN<n> and RPUL<n> by performing a logical operation of the master signal, if the input row addresses correspond to the fail row addresses stored in the redundancy coding section, outputting a ninth control signal DECDIS for inactivating normal input/output paths and a tenth control signal REDEN for activating redundancy input/output paths through the redundancy control section which receives the eighth control signal RPUL<n> as its input, and inactivating driving of corresponding main cells of a main cell array section and activating driving of corresponding redundancy cells of a redundancy cell array section by the eighth to tenth control signals REN<n>, DECDIS and REDEN.

In still another aspect of the present invention, a method of repairing a nonvolatile ferroelectric memory device in a fail column address relieving method, includes the steps of storing fail column addresses in a plurality of redundancy coding cells of a redundancy coding section composed of a ferroelectric capacitor, a redundancy master cell and the redundancy coding cells, and storing fail input/output numbers FION<r> which indicate input/output lines corresponding to the fail column addresses in redundancy input/output coding cells of a redundancy input/output coding section composed of a ferroelectric capacitor, and the redundancy input/output coding cells, if input column addresses satisfy conditions programmed by a user, activating a master signal through the redundancy master cell by outputting to the redundancy coding section a set signal, a reset signal and first to sixth control signals ENN, ENP, EQN<, CPL, ENW<n> and PREC, if the input column addresses correspond to the fail column addresses stored in the redundancy coding cells, outputting a seventh control signal RPUL<n> by performing a logical operation of the master signal, outputting an eighth control signal DECDIS and a redundancy read/write mode control signal WLRHR for activating driving of the redundancy cells through a redundancy control section which receives the read/write mode control signal WLRH and the seventh control signal RPUL<n> as its inputs, and inactivating driving of normal input/output paths by receiving the eighth control signal DECDIS and activating driving of redundancy input/output paths corresponding to the inactivated normal input/output paths by receiving the redundancy read/write mode control signal WLRHR.

In order to realize the above methods, a circuit for repairing a nonvolatile ferroelectric memory device according to a first embodiment of the present invention includes an address latch for maintaining and outputting input row addresses for one period, a state diagram generating section for outputting first to sixth control signals ENN, ENP, EQN, ENW<n>, CPL and PREC for activating a fail relieving operation, a set signal and a reset signal if the input row addresses satisfy conditions encrypted by a user, and a programmable redundancy coding section for activating a master signal by receiving the first to sixth control signals ENN, ENP, EQN, ENW<n>, CPL and PREC, the set signal and the reset signal, storing fail row address in a plurality of redundancy coding cells, and if the input row addresses correspond to the stored fail row addresses, outputting seventh to tenth control signals REN<n>, RPUL<n>, DECDIS and RENEN for inactivating normal data input/output paths and activating data input/output paths which can be used as redundancy paths.

A circuit for repairing a nonvolatile ferroelectric memory device according to a second embodiment of the present invention includes an address latch for maintaining and outputting input column addresses for one period, a state diagram generating section for generating first to sixth control signals ENN, ENP, EQN, CPL, ENW<n> and PREC for activating a fail relieving operation, a set signal, a reset signal and pulses of fail input/output (IO) numbers FION<r> if the input column addresses satisfy conditions encrypted by a user, and a programmable redundancy coding section for receiving an eighth control signal WLRH for controlling an operation of a main amplifier, the first to sixth control signals ENN, ENP, EQN, CPL, ENW<n> and PREC, the set signal and the reset signal, and outputting a seventh control signal RPUL<n>, a ninth control signal WLRHR for controlling an operation of a redundancy amplifier, and a tenth control signal RIODIS for controlling an input/output for a normal operation, a redundancy IO multiplexer coding section for storing the first to fifth control signals ENN, ENP, EQN, CPL and ENW<n> and fail IO numbers FION<r>, and connecting data input/output to main input/output MIO<r> or redundancy input/output RIO<q> under the control of the seventh control signal RPUL<n>, and a normal IO path section for receiving the tenth control signal RIODIS and connecting the data input/output to the main input/output MIO<r>.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
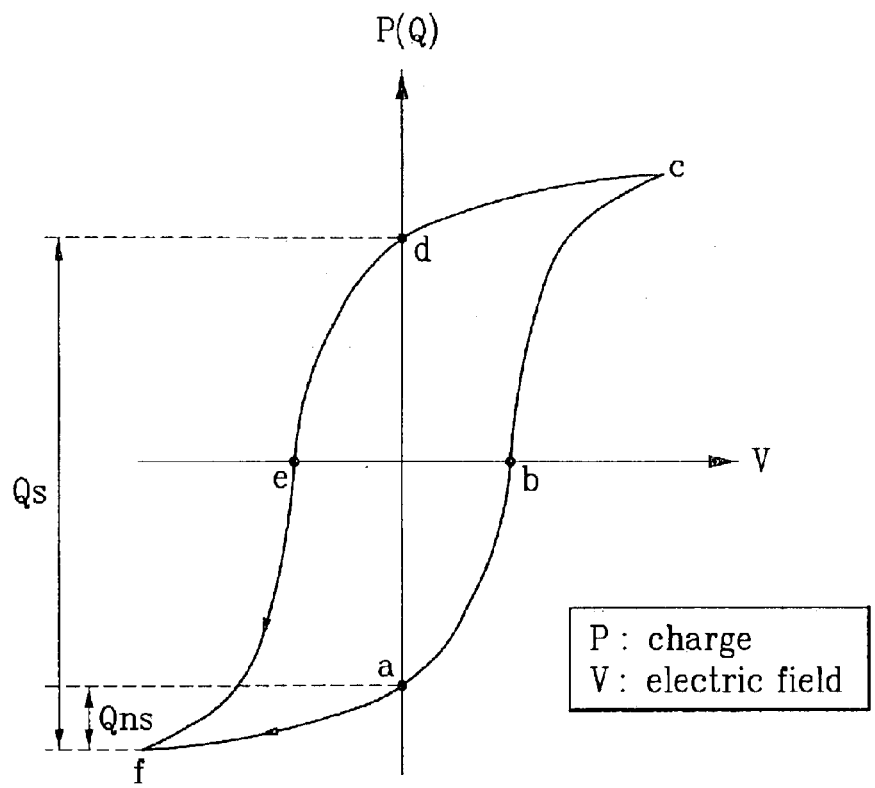
FIG. 1 is a characteristic diagram illustrating the hysteresis loop of a general ferroelectric material.
Figure 2:
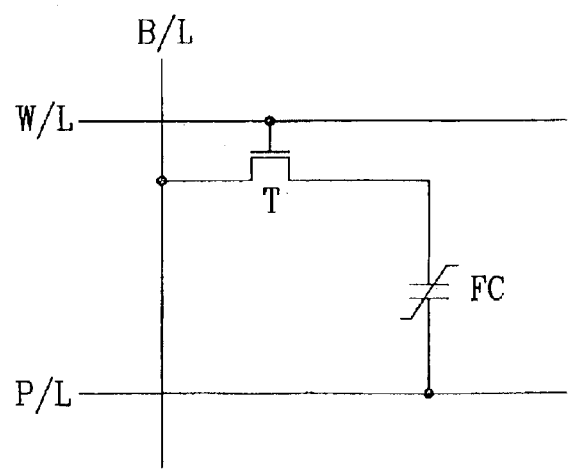
FIG. 2 is a view illustrating the construction of a unit cell of a conventional nonvolatile ferroelectric memory device.
Figure 3:
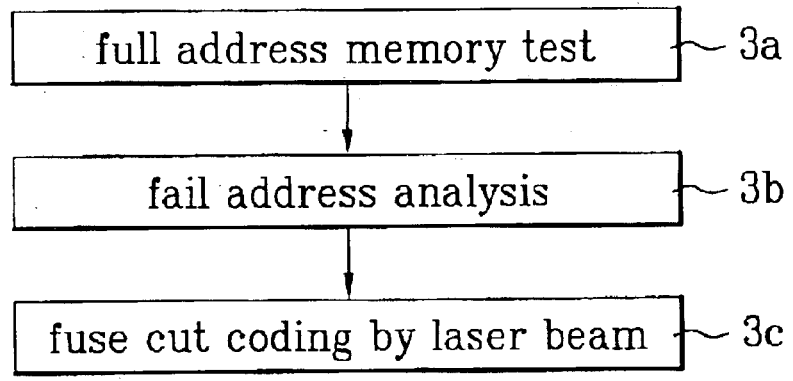
FIG. 3 is a view illustrating a conventional repair algorithm of a nonvolatile ferroelectric memory device.
Figure 4:
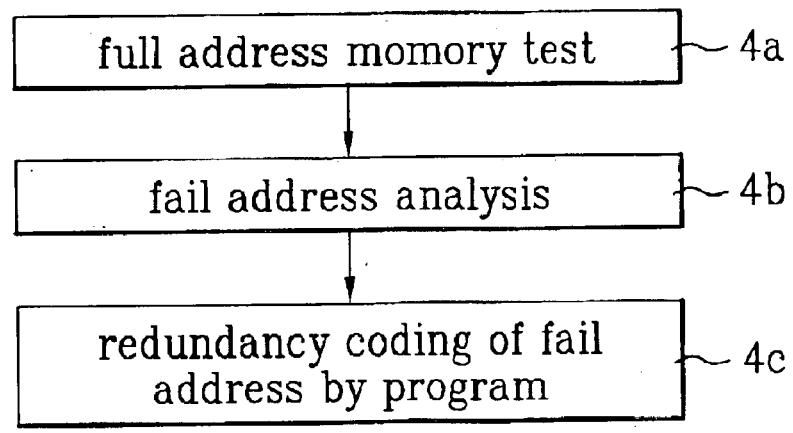
FIG. 4 is a view illustrating a repair algorithm of a nonvolatile ferroelectric memory device according to the present invention.

FIG. 4 is a view illustrating a repair algorithm of a nonvolatile ferroelectric memory device according to the present invention.

After manufacturing and packaging processes are completed, a chip test of the ferroelectric memory device is performed through proceeding of a full address memory test and fail address analysis step for finding the fail address (4a).

After the whole memory cells are tested as above, the fail address is analyzed (4b).

Then, a main cell corresponding to the fail address is replaced with a redundancy cell using a redundancy program coding (4c).

Now, a repair circuit of a nonvolatile ferroelectric memory device according to the present invention for realizing the replacement by the redundancy cell using the redundancy program coding will be explained.

First, a repair circuit of a nonvolatile ferroelectric memory device using a row redundancy algorithm according to the first embodiment of the present invention will be explained, and then a repair circuit of a nonvolatile ferroelectric memory device using a column redundancy algorithm according to the second embodiment of the present invention will be explained.

Figure 5:
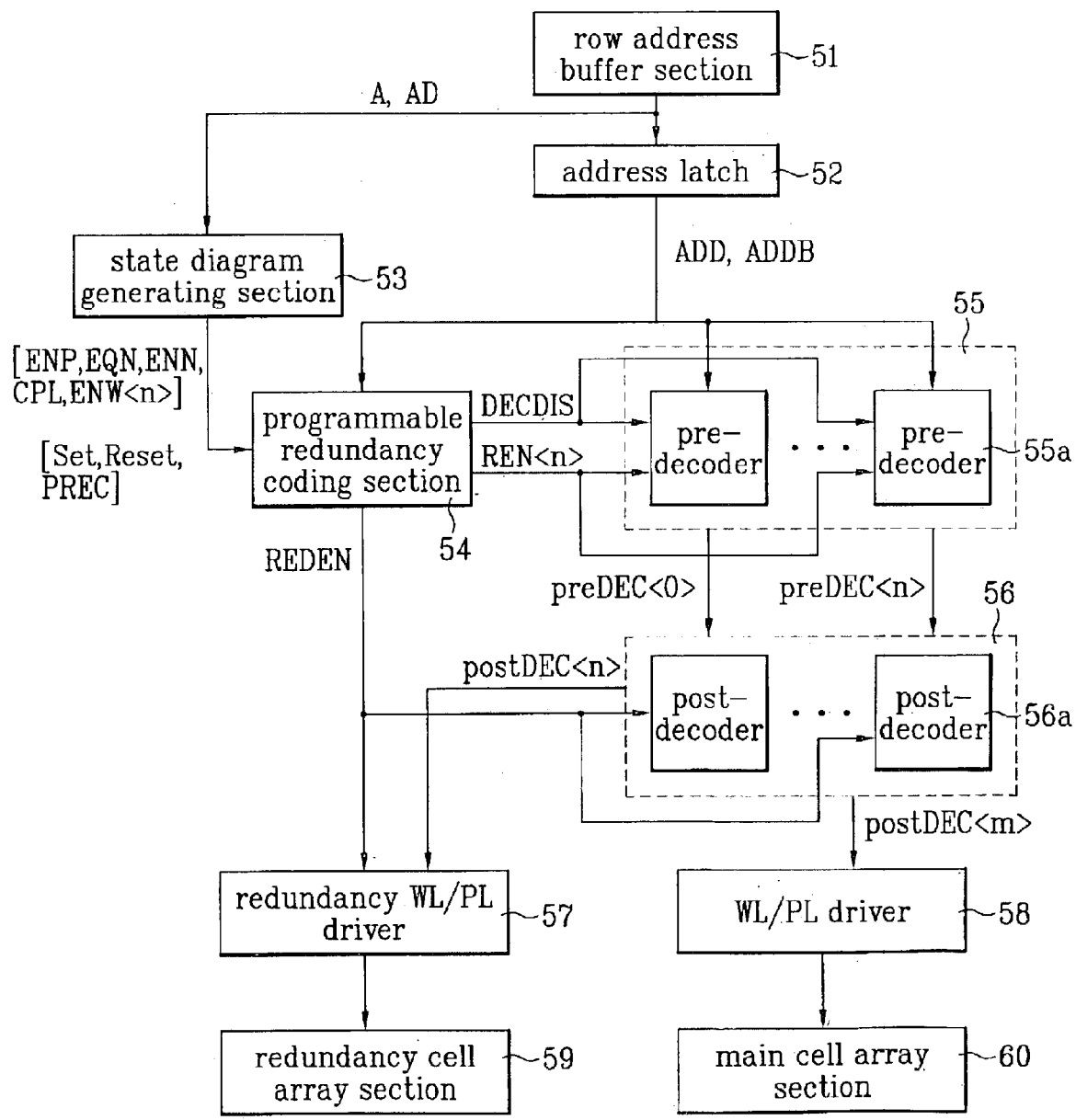
FIG. 5 is a block diagram of a row redundancy algorithm block of a nonvolatile ferroelectric memory device according to a first embodiment of the present invention.

FIG. 5 is a block diagram of a row redundancy algorithm block of a nonvolatile ferroelectric memory device according to the first embodiment of the present invention.

As shown in FIG. 5, a ferroelectric RAM (FeRAM) for implementing the row redundancy includes a row address buffer section 51, an address latch 52, a state diagram generating section 53, a programmable redundancy coding section 54, a pre-decoder section 55 composed of a plurality of pre-decoders 55a, a post-decoder section 56 composed of a plurality of post-decoders 56a, a redundancy word line/plate line (WL/PL) driver 57, a WL/PL driver 58, a redundancy cell array section 59, and a main cell array section 60.

The row address buffer section 51 transfers first and second input addresses A and AB inside a chip. The address latch 52 maintains the first and second input addresses A and AB for one cycle, and outputs them as first and second addresses ADD and ADDB.

The state diagram generating section 53 outputs to the programmable redundancy coding section 54 common signals ENN, ENP, EQN, CPL and ENW<n>, a PREC signal, a set signal and a reset signal according to the first and second addresses ADD and ADDB.

The ENP signal is a PMOS transistor enable signal, EQN an equalizer signal, CPL a plate line control signal, ENN an NMOS transistor enable signal, and PREC a signal having a 'high' level in an active region, and a 'low' level in a pre-charge region.

The programmable redundancy coding section 54 stores the address where the fail is produced in the redundancy coding cell, and if the input address corresponds to the fail column address, it outputs a control signal for the redundancy operation. The programmable redundancy coding section receives signals (i.e., the common signals, PREC signal, set signal and reset signal) inputted from the state diagram generating section 53, outputs the DECDIS signal and the REN<n> signals to the plurality of pre-decoders of the pre-decoder section 55, and outputs the REDEN signal to the redundancy WL/PL driver 57.

Also, the pre-decoder section 55 inactivates the normal pre-decoder paths using the DECDIS signal, and activates only the pre-decoder paths that can be used as the redundancy using the REN<n> signals.

Also, the post-decoder section 56 inactivates the normal post-decoder paths according to the operation of the pre-decoder section 55, and activates the post-decoder paths that have received the PreDEC<n> signals from the pre-decoders activated by the REN<n> signals.

The redundancy WL/PL driver 57 is enabled by the PostDEC<n> signals outputted from the activated pose-decoder paths and the REDEN signal outputted from the programmable redundancy coding section 54, and activates the corresponding redundancy cells of the redundancy cell array section 58 accordingly. While the redundancy cells are activated, the corresponding main cells of the main cell array section 60 are inactivated.

Figure 14:
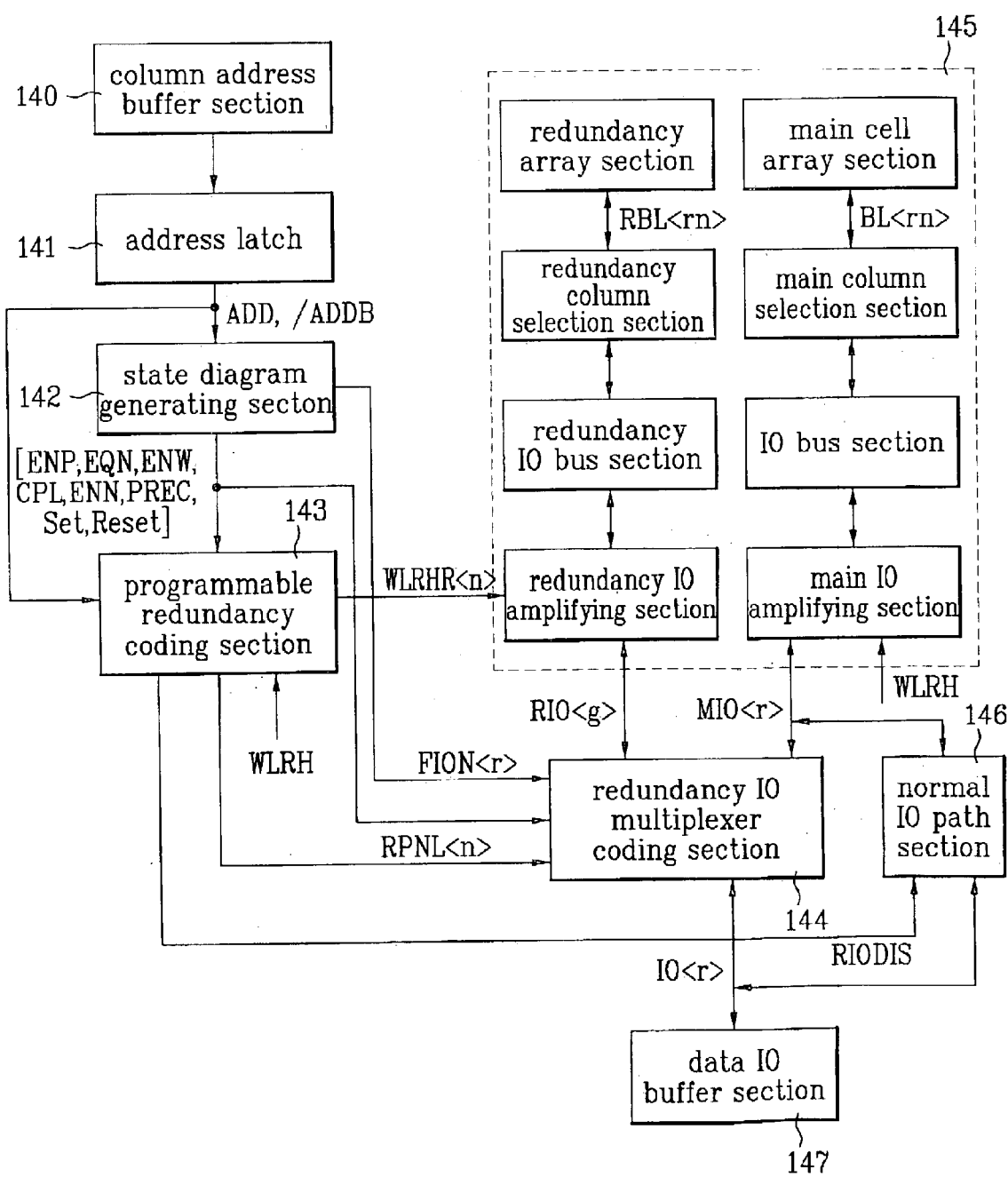
FIG. 14 is a block diagram of a column redundancy algorithm block of a nonvolatile ferroelectric memory device according to a second embodiment of the present invention.

The state diagram generating section 53 is the same as the state diagram generating section 142 according to the second embodiment of the present invention as illustrated in FIG. 14, which will be explained later.

Next, the construction and operation of the programmable redundancy coding section 54 and the re-decoder section 55 will be explained.

The programmable redundancy coding section 54 is composed of a plurality of unit redundancy coding sections 54a and a redundancy control section 54b.

Figure 6:
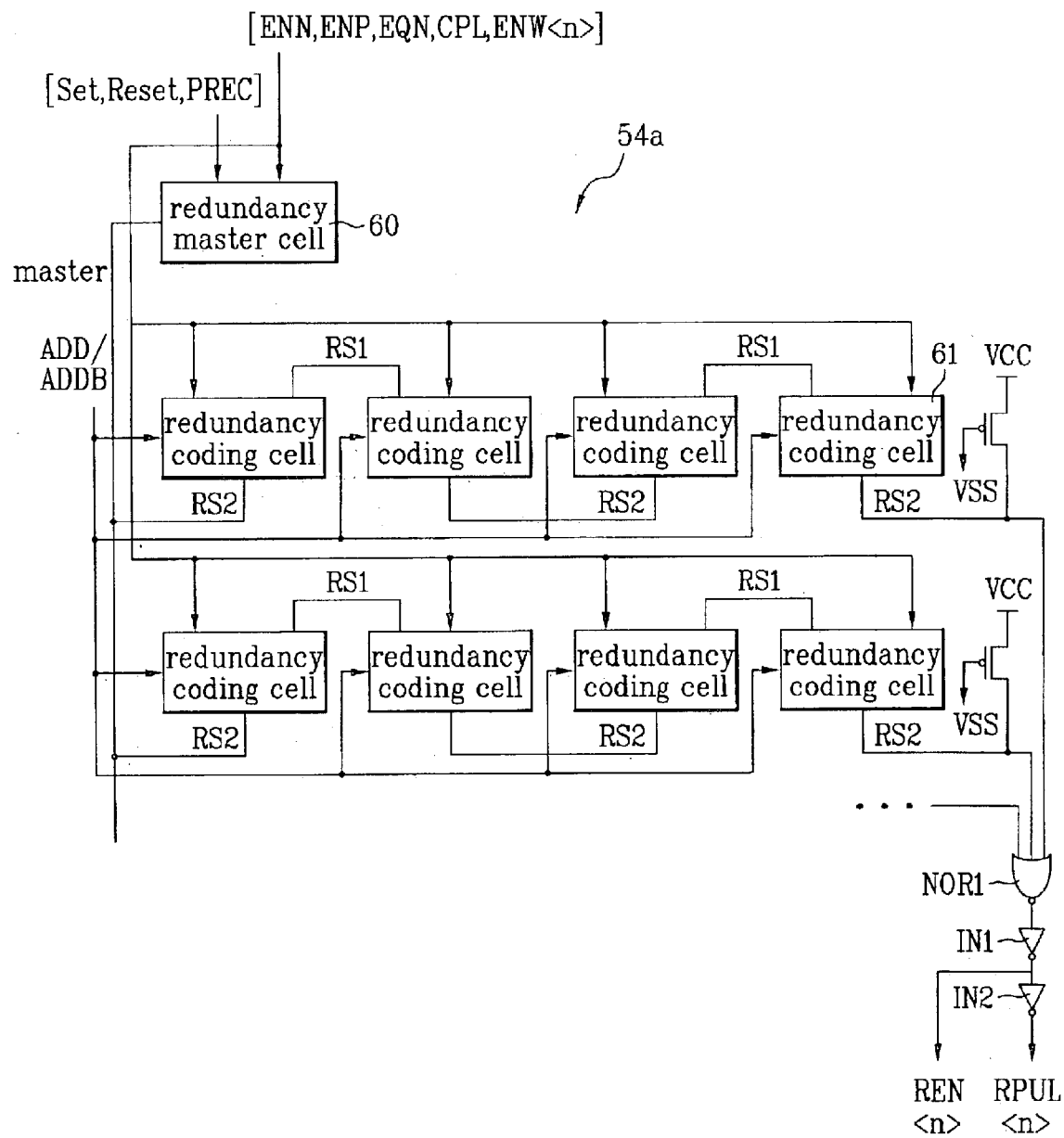
FIG. 6 is a block diagram of a unit redundancy coding section.
Figure 7:
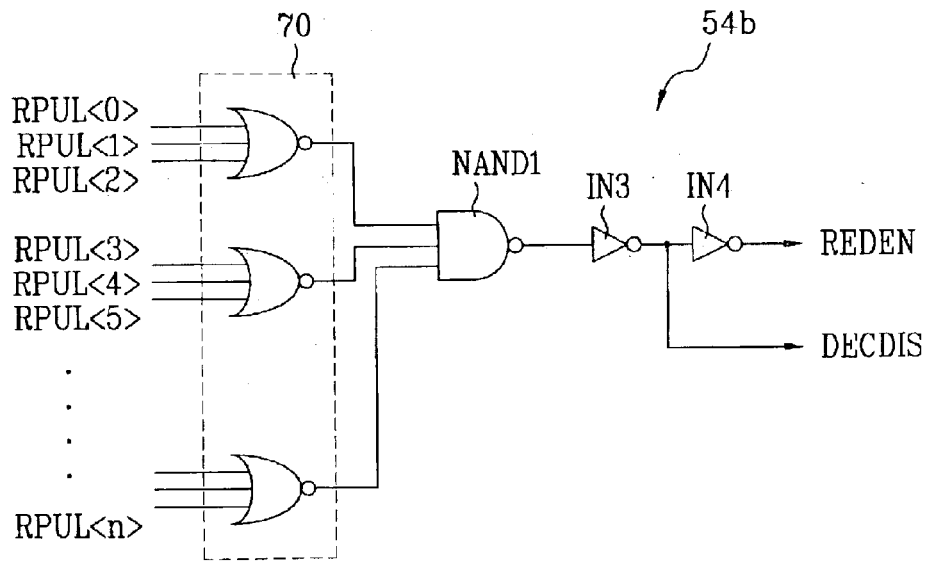
FIG. 7 is a circuit diagram of a redundancy control section.

FIG. 6 is a block diagram of the unit redundancy coding section 54a, and FIG. 7 is a circuit diagram of the redundancy control section 54b.

The unit redundancy coding section 54a, as shown in FIG. 6, includes a redundancy master cell 60, a plurality of redundancy coding cells 61, a first NOR gate NOR1 for receiving and NOR-gating output signals according to on/off states of the redundancy coding cells 61, a first inverter IN1 for inverting an output signal of the NOR gate NOR1 and outputting the REN<n> signals, a second inverter IN2 for inverting the output signal of the first inverter IN1 and outputting the RPUL<n> signals, and PMOS transistors connected to final output terminals of the plurality of redundancy coding cells 61 connected together in a column direction.

The redundancy master cell 60 outputs a master signal for determining whether to activate or inactivate the operation of the whole redundancy coding cells. The redundancy coding cells 61 are arranged by groups in a column direction to transfer the master signal (in the embodiment, four redundancy coding cells per group are arranged in the column direction).

The first redundancy coding cell among the four redundancy coding cells arranged in the column direction receives the master signal through an RS2 line, and the first and second redundancy coding cells are connected through an RS1 line. The second and third redundancy coding cells are connected through the RS2 line, and the third and fourth coding cells are connected through the RS1 line.

Whether the master signal is transferred through one input terminal of the first NOR gate NOR1 is determined by the connection state of the RS1 and RS2 according to the operation of the four redundancy coding cells 61 arranged in the column direction. The PMOS transistors are connected between final output terminals of the redundancy coding cells connected in the column direction to transfer the master signal and a power supply voltage terminal Vcc, and receive a ground level voltage Vss, respectively.

The redundancy master cell 60 receives the common signals ENN, ENP, ENW<n> and CPL outputted from the state diagram generating section 53, the PREC signal, the set signal and the reset signal, and in a default state, it is inactivated to output a 'high' level master signal, while in an active state, it outputs a 'low' level master signal.

Also, the redundancy coding cells 61 serve to store the fail address.

If the fail address is inputted as an input address ADD after the fail address is stored, the RS1 and RS2 lines are in a connected state to each other to make current flow therethrough, while if input address is not the fail address, the RS1 and RS2 lines are in an open state to make current not flow therethrough.

Accordingly, only when all the redundancy coding cells 61 are in an 'on' state, the REN<n> signals are outputted with a 'low' level, while otherwise, the REN<n> signals are outputted with a 'high' level.

Also, only when the REN<n> signals are in a 'low' state, the redundancy path of the pre-decoder in FIG. 5 can be activated.

Meanwhile, the RPUL<n> signals are outputted with a 'high' level in a corresponding redundancy state. As described above, from the address coding section 54a are outputted one REN<n> signal and one RPUL<n> signal.

The redundancy control section 54b includes a first NOR gate section 70 composed of a plurality of 3-input NOR gates, a first NAND gate NAND1 for NAND-gating output signals of the NOR gates of the first NOR gate section 70, a third inverter IN3 for inverting an output signal of the first NAND gate NAND1 and outputting the DECDIS signal, and a fourth inverter IN4 for inverting an output signal of the third inverter IN3 and outputs the REDEN signal.

At this time, three RPUL<n> signals from the unit redundancy coding sections 54a are inputted to each NOR gate of the first NOR gate section 70.

The REDEN signal is directly inputted to the redundancy WL/PL driver 57, and the DECDIS signal is used to inactivating the main pre-decoder path.

Next, the pre-decoder section for activating the redundancy path will be explained in detail.

Figure 8:
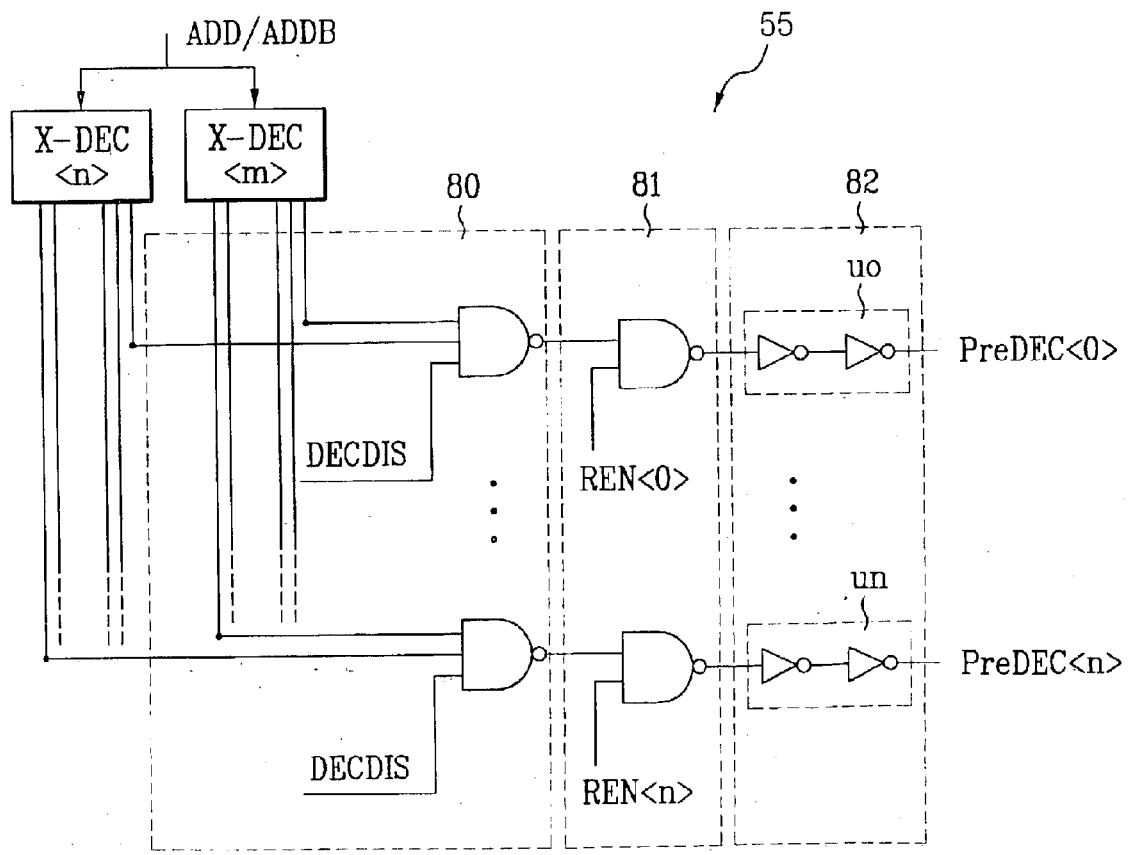
FIG. 8 is a circuit diagram of a pre-decoder section.

FIG. 8 is a circuit diagram of the pre-decoder section.

The pre-decoder section 55, as shown in FIGS. 5 and 8, is composed of a plurality of pre-decoders. 55a, and each pre-decoder 55a includes a first NAND gate section 80 composed of a plurality of NAND gates each of which receives and performs a NAND-gating of a first row address from X-DEC<n> signals, a second row address from X-DEC<m> signals, and the DECDIS signal from the redundancy control section 54b, a second NAND gate section 81 composed of a plurality of NAND gates each of which receives and performs a NAND gating of an output signal of the respective NAND gate of the first NAND gate section 80 and the REN<n> signals, and a delay circuit 82 composed of a plurality of delay sections U0~Un for delaying/outputting output signals of the respective NAND gates of the second NAND gate section 81.

According to the above-described construction, if the DECDIS signal is in a 'low' level state, all the NAND gates of the first NAND gate section 80 output 'high' level signals irrespective of the first and second row addresses.

Thus, the outputs of the respective NAND gates of the second NAND gate section 81 are determined by the REN<n> signals.

The output signals determined according to the REN<n> signals are delayed through the respective delay sections U0~Un of the delay circuit 82.

As described above, if the DECDIS signal is in a 'low' level state, the output signals of the pre-decoder section 55 are determined only by the REN<n> signals irrespective of the input addresses.

Next, the input/output relation among the post-decoder section 56, the redundancy WL/PL driver 57, and the redundancy cell array section 59 which receive the PreDEC<n> signal outputted from the pre-decoder section 55 will be explained.

Figure 9:
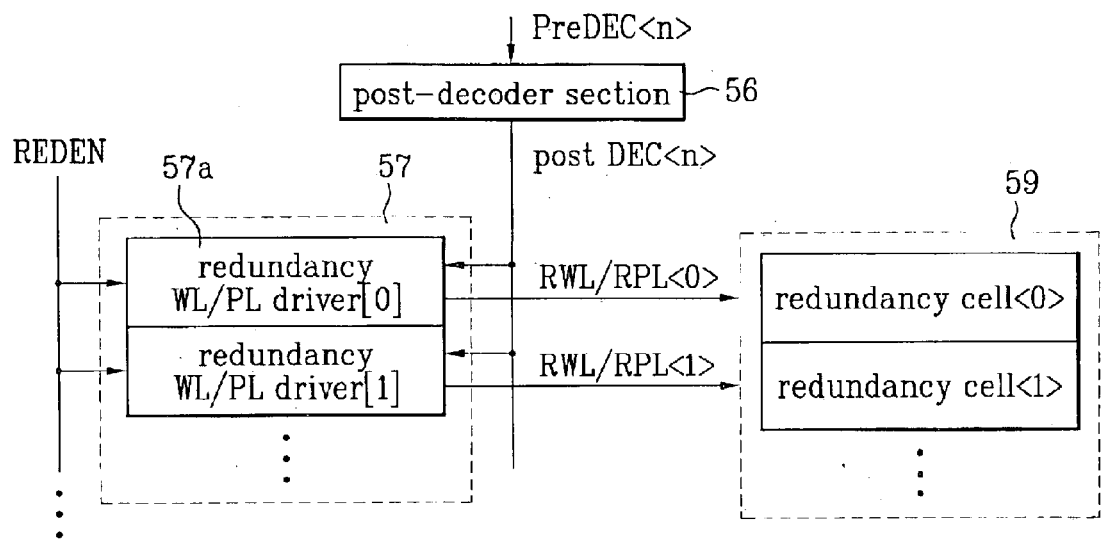
FIG. 9 is a view illustrating signal input/output relation among a post-decoder section, a redundancy word line/plate line driver and a redundancy cell array section.

FIG. 9 is a view illustrating the signal input/output relation among the pose-decoder section 56, the redundancy WL/PL driver 57, and the redundancy cell array section 59.

As shown in FIG. 9, the post-decoder section 56 receives the PreDEC<n> signals outputted from the pre-decoder section 55, and outputs PostDEC<n> signals to the redundancy WL/PL driver 75. The redundancy WL/PL driver 57 is composed of a plurality of unit redundancy WL/PL drivers 57a for receiving the PostDEC<n> signals and the REDEN signal from the programmable redundancy coding section 54, and outputting RWL/RPL<n> signals for activating the redundancy cells of the redundancy cell array section 59.

The PreDEC<n> signal is used to select one among the plurality of row addresses in the redundancy cell array section 59. As a result, the PreDEC<n> signal is used for the redundancy WL/PL driver 57 to activate one among the row addresses of the redundancy array section 59.

Also, in a normal operation region, since all the REN<n> signals and the DECDIS signal are in a 'high' state, normal address decoder paths are activated.

Next, the construction of the redundancy WL/PL driver 57 and the redundancy cell array section 59, and the WL/PL driver 58 and the main cell array section 60 will be explained along with the detailed circuit construction of the redundancy WL/PL driver 57.

Figure 10:
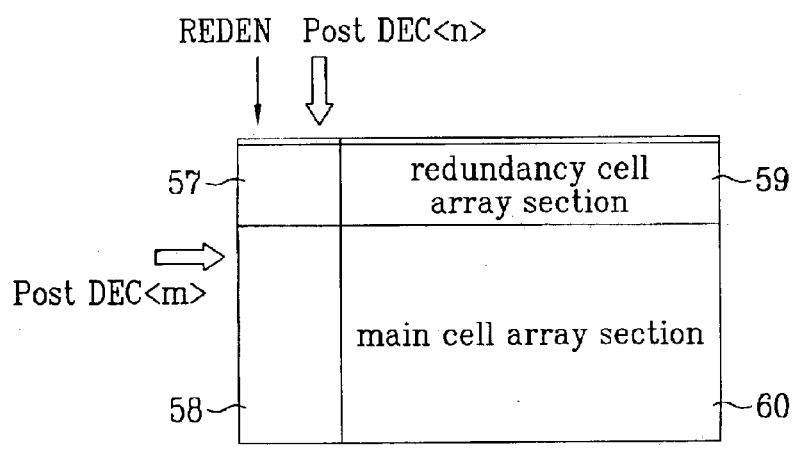
FIG. 10 is a view illustrating the construction of a redundancy cell array section, a main cell array section and drivers for driving the sections.
Figure 11:
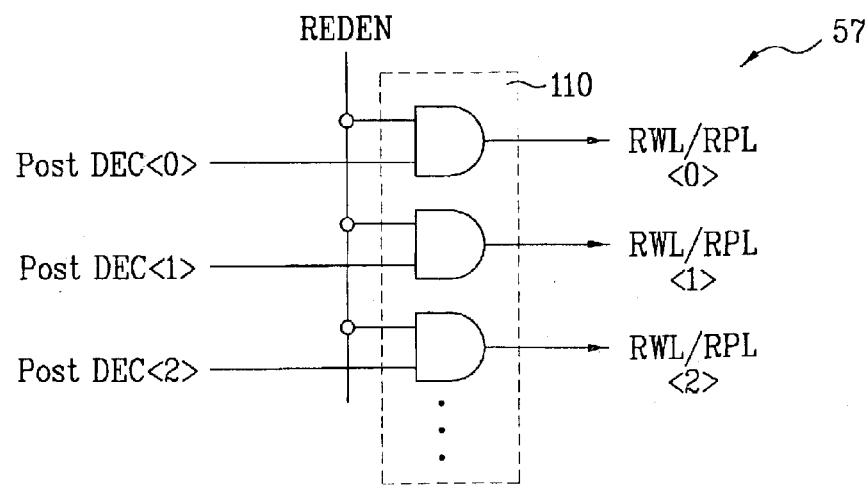
FIG. 11 is a circuit diagram of a redundancy word line/plate line driver.

FIG. 10 is a view illustrating the construction of the redundancy cell array section, the main cell array section and drivers for driving the array sections. FIG. 11 is a circuit diagram of the redundancy word line (WL)/plate line (PL) driver.

The redundancy WL/PL driver 57, as shown in FIG. 10, receives the REDEN signal and the PostDEC<n> signals from the activated post-decoders, and activates the corresponding redundancy cells among the redundancy cells from the redundancy cell array section 59.

Also, the WL/PL driver 58 receives the PostDEC<m> signals, and activates the remaining main cells except for the main cells corresponding to the redundancy cells selected by the redundancy WL/PL driver 57 among the main cells of the main cell array section 60.

The detailed circuit construction of the redundancy WL/PL driver 57 will be explained with reference to FIG. 11.

The redundancy WL/PL driver 57 includes an AND gate section 110 composed of a plurality of AND gates which receive the REDEN signal from the programmable redundancy coding section 54 and the PostDEC<n> signals from the plurality of post-decoders 56a of the post-decoder section 56, and output redundancy WL/PL signals RWL/RPL<n>.

Thus, only the redundancy WL/PL signals RWL/RPL from the AND gates, to which the activated REDEN signal and the signals from the activated post-decoders among the PostDEC<n> signals are inputted, are selected.

Next, the construction of the redundancy master cell 60 and the redundancy coding cell 61 will be explained.

Figure 12:
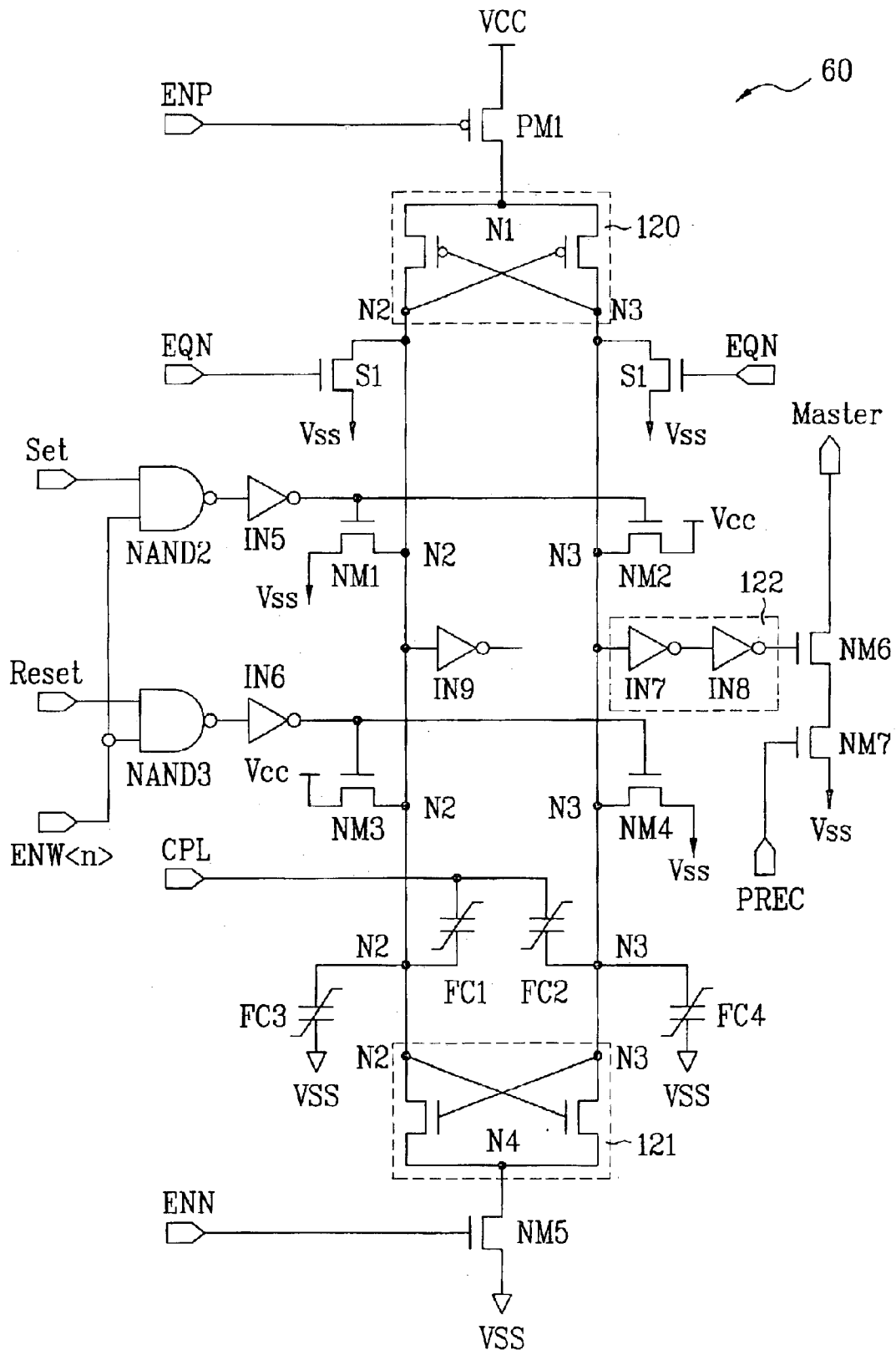
FIG. 12 is a circuit diagram of a redundancy master cell of FIG. 6.
Figure 13:
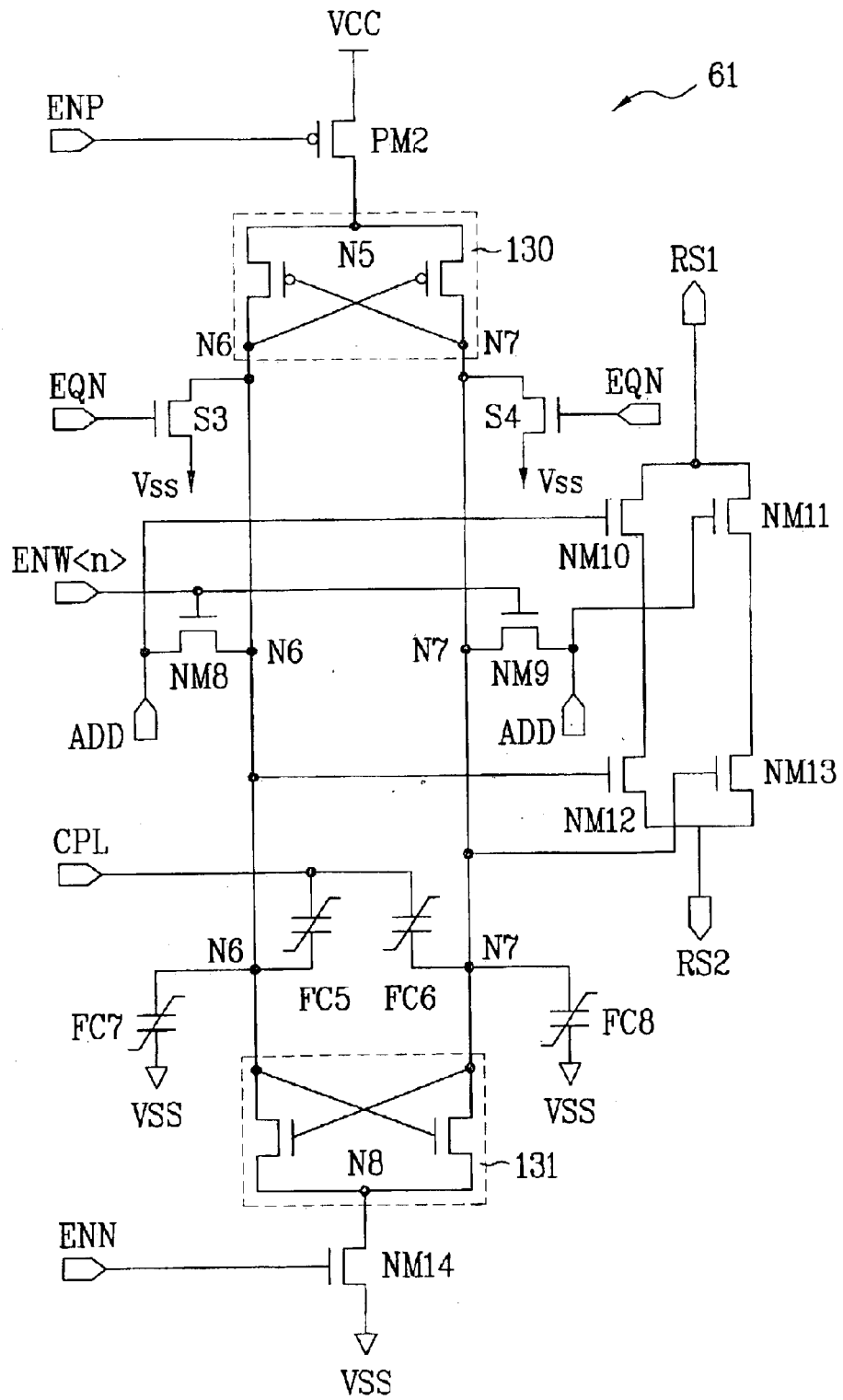
FIG. 13 is a circuit diagram of a redundancy coding cell of FIG. 6.

FIG. 12 is a circuit diagram of the redundancy master cell of FIG. 6, and FIG. 13 is a circuit diagram of the redundancy coding cell of FIG. 6.

The redundancy master cell 60 receives the common signals ENN, ENP, EQN, CPL and ENW<n>, the PREC signal, the set signal and the reset signal, and determines the output of the master signal. The redundancy coding cell 61 stores the fail address, receives the common signals ENN, ENP, EQN, CPL and ENW<n>, and determines the connection/disconnection of the RS1 and RS2 lines.

The redundancy master cell 60, as shown in FIG. 12, includes a first PMOS transistor PM1 for receiving a PMOS enable signal ENP and transferring a power supply voltage Vcc to a first node N1, a first latch 120 one node of which is connected to the first node N1 and the other node of which is connected to second and third nodes N2 and N3, first and second NMOS switches S1 and S2 for receiving an equalizer signal EQN and applying a ground voltage Vss to the second and third nodes N2 and N3, respectively, a second NAND gate NAND2 for NAND-gating the set signal and the ENW<n> signals from the state diagram generating section 53, a fifth inverter IN5 for inverting an output signal of the second NAND gate NAND2, a third NAND gate NAND3 for NAND-gating the reset signal and the ENW<n> signals from the state diagram generating section 53, a sixth inverter IN6 for inverting an output signal of the third NAND gate NAND3, a first NMOS transistor NM1 a gate of which an output signal of the fifth inverter IN5 is inputted to, one terminal of which a signal of the second node N2 is transferred to, and the other terminal of which is connected to a terminal of the ground voltage Vss, a second NMOS transistor NM2 a gate of which the output signal of the fifth inverter IN5 is inputted to, one terminal of which a signal of the third node N3 is transferred to, and the other terminal of which is connected to a terminal of the DC voltage Vcc, a third NMOS transistor NM3 a gate of which an output signal of the sixth inverter IN6 is inputted to, one terminal of which the signal of the second node N2 is transferred to, and the other terminal of which is connected to the terminal of the power supply voltage Vcc, a fourth NMOS transistor NM4 a gate of which the output signal of the sixth inverter IN6 is inputted to, one terminal of which the signal of the third node N3 is transferred to, and the other terminal of which is connected to the terminal of the ground voltage Vss, a fifth NMOS transistor NM5 for receiving an NMOS enable signal ENN and transferring the ground voltage Vss to a fourth node N4, a second latch 121 one node of which is connected to the fourth node N4 and the other node of which is connected to the second and third nodes N2 and N3, a first ferroelectric capacitor FC1 connected between an input node of the CPL signal and the second node N2, a second ferroelectric capacitor FC2 connected between the input node of the CPL signal and the third node N3, a third ferroelectric capacitor FC3 connected between the second node N2 and the terminal of the ground voltage Vss, a fourth ferroelectric capacitor FC4 connected between the third node N3 and the terminal of the ground voltage Vss, seventh and eighth inverters IN7 and IN8, a first delay section 122 for delaying the output of the third node N3 for a predetermined time period, a ninth inverter IN9, connected to the second node N2, for matching loading of the second node N2 with respect to the seventh and eighth inverters IN7 and IN8 connected to the third node N3, and sixth and seventh NMOS transistors NM6 and NM7, connected in series between a master signal output terminal and the terminal of the ground voltage Vss, for being controlled by an output signal of the first delay section 122 and the PREC signal.

According to the construction as described above, if both the sixth NMOS transistor NM6 and the seventh NMOS transistor NM7 are turned on, the master signal is activated to be in a 'low' state.

The first latch 120 is composed of two PMOS transistors, and the second latch 121 is composed of two NMOS transistors.

In the first and second ferroelectric capacitors FC1 and FC2 are always stored data opposite to each other, and the third and fourth ferroelectric capacitors FC3 and FC4 serve as capacitance loading devices required when sensing and reading out the stored data.

The redundancy master cell 60 receives and operates by the common signals ENN, ENP, EQN, CPL and EWN<n> from the state diagram generating section 53, but receives the PREC signal and the master signal through different paths.

In case of using the redundancy, a 'high' level set signal and a 'low' level reset signal are inputted from the state diagram generating section 53, and this makes the first and second NMOS transistors NM1 And NM2 turned on and the third and fourth NMOS transistors NM3 and NM4 turned off. Thus, the second node N2 and the third node N3 are in a 'low' level state and in a 'high' level state.

Accordingly, the 'high' level signal of the third node N3 is outputted through the first delay section 122, and turns on the sixth NMOS transistor NM6.

The PREC signal goes to a 'high' level in an active region, and activates the master signal by turning on the seventh NMOS transistor NM7, but in a pre-charge region, it goes to a 'low' level, and inactivates the master signal as a 'high' level by turning off the seventh NMOS transistor NM7.

Also, in a normal operation state, i.e., in case that the redundancy is not used, a 'low' level set signal and a 'high' level reset signal are inputted from the state diagram generating section 53, and this makes the first and second NMOS transistors NM1 And NM2 turned off and the third and fourth NMOS transistors NM3 and NM4 turned on. Thus, the signal of the third node N3 are in a 'low' level state.

Accordingly, the 'low' level signal of the third node N3 is outputted through the first delay section 122, and turns off the sixth NMOS transistor NM6 to inactivate the master signal as a 'high' level.

Meanwhile, the redundancy coding cell 61, as shown in FIG. 13, includes a second PMOS transistor PM2 for receiving a PMOS enable signal ENP and transferring a power supply voltage Vcc to a fifth node N5, a third latch 130 one node of which is connected to the fifth node N5 and the other node of which is connected to sixth and seventh nodes N6 and N7, third and fourth NMOS switches S3 and S4 for receiving an equalizer signal EQN and applying a ground voltage Vss to the sixth and seventh nodes N6 and N7, respectively, an eighth NMOS transistor NM8 a gate of which the ENW<n> signals are inputted to, one terminal of which a signal of the sixth node N6 is transferred to, and the other terminal of which a first address ADD is applied to, a ninth NMOS transistor NM9 a gate of which the ENW<n> signals are inputted to, one terminal of which a signal of the seventh node N7 is transferred to, and the other terminal of which a second address ADDB is applied to, tenth and eleventh NMOS transistors NM10 and NM11 which are determined to be turned on/off according to the first and second addresses ADD and ADDB, a fourteenth NMOS transistor NM14 for receiving an NMOS enable signal ENN and transferring the ground voltage Vss to the eighth node N8, a fourth latch 131 one node of which is connected to the eighth node N8 and the other node of which is connected to the sixth and seventh nodes N6 and N7, a fifth ferroelectric capacitor FC5 connected between an input node of the CPL signal and the sixth node N6, a sixth ferroelectric capacitor FC6 connected between the input node of the CPL signal and the seventh node N7, a seventh ferroelectric capacitor FC7 connected between the sixth node N6 and the terminal of the ground voltage Vss, an eighth ferroelectric capacitor FC8 connected between the seventh node N7 and the terminal of the ground voltage Vss, twelfth and thirteenth NMOS transistors NM13 and NM14 which are determined to be turned on/off by the control of signals of the sixth node N6 and the seventh node N7.

According to the construction as described above, if the tenth NMOS transistor NM10 and the twelfth NMOS transistor NM12 are turned on, or the eleventh NMOS transistor NM11 and the thirteenth NMOS transistor NM 13 are turned on, the RS1 and the RS2 are connected together.

The third latch 130 is composed of two PMOS transistors, and the fourth latch 131 is composed of two NMOS transistors.

In the fifth and sixth ferroelectric capacitors FC5 and FC6 are always stored data opposite to each other, and the seventh and eighth ferroelectric capacitors FC7 and FC8 serve as capacitance loading devices required when sensing and reading out the stored data.

The RS1 and RS2 are nodes for outputting to the outside what fail address is stored in the redundancy coding cell.

For example, if the fail address is 'high', the first address ADD becomes 'high', and the second address ADDB becomes 'low'.

If the eighth and ninth NMOS transistors NM8 and NM9 are turned on by the ENW<n> signals, 'high' level data and 'low' level data are stored in the fifth and sixth ferroelectric capacitors FC5 and FC6, respectively, and the fail row address is stored in the redundancy coding cells 61.

Thereafter, if the corresponding fail address is inputted, the sixth node N6 and the first address ADD are in a 'high' level state, and the tenth NMOS transistor NM10 and the twelfth NMOS transistor NM12 are turned on, so that the RS1 and the RS2 are in a low-resistance state that current can flow therethrough.

On the contrary, if an address that is not the corresponding fail address is inputted, the sixth node N6 becomes 'high', and the first address ADD becomes 'low'. Thus, the tenth NMOS transistor NM10 is turned off, and the twelfth NMOS transistor NM12 is turned on, so that the RS1 and The RS2 are in a fixed-resistance state that no current can flow therethrough.

Next, if the fail address is in a 'low' state, the first address ADD becomes 'low', and the second address ADDB becomes 'high'.

If the eighth and ninth NMOS transistors NM8 and NM9 are turned on by the ENW<n> signals activated as the 'high' level, 'low' level data and 'high' level data are stored in the fifth and sixth ferroelectric capacitors FC5 and FC6, respectively, and the fail row address is stored in the redundancy coding cells 61.

Thereafter, if the corresponding fail address is inputted, the seventh node N7 and the second address ADDB are in a 'high' level state, and the eleventh NMOS transistor NM11 and the thirteenth NMOS transistor NM13 are turned on, so that the RS1 and the RS2 are in a low-resistance state that current can flow therethrough.

On the contrary, if an address that is not the corresponding fail address is inputted, the seventh node N7 becomes 'high', and the second address ADDB becomes 'low'. Thus, the eleventh NMOS transistor NM11 is turned off, and the thirteenth NMOS transistor NM13 is turned on, so that the RS1 and The RS2 are in a fixed-resistance state that no current can flow therethrough.

Accordingly, only when the corresponding address stored in the redundancy coding cells is inputted as the input address, the master signal is transferred to the input terminal of the first NOR gate NOR1 through the redundancy coding cells.

Next, a repair circuit by a column redundancy algorithm according to the second embodiment of the present invention will be explained.

FIG. 14 is a block diagram of a column redundancy algorithm block of a nonvolatile ferroelectric memory device according to the second embodiment of the present invention.

As shown in FIG. 14, a nonvolatile ferroelectric memory device includes a column address buffer section 140, an address latch 141, a state diagram generating section 142, a programmable redundancy coding section 143, a redundancy input/output (IO) multiplexer coding section 144, a core mat section 145, a normal IO path section 146, and a data input/output buffer section 147.

The column address buffer section 140 transfers first and second input addresses A and AB inside a chip. The address latch 141 maintains the first and second input addresses A and AB for one cycle, and outputs them as first and second addresses ADD and ADDB.

The state diagram generating section 142 outputs to the programmable redundancy coding section 54 common signals ENP, EQN, ENW<n>, CPL and ENN, a set signal a reset signal, and a PREC signal according to the first and second addresses ADD and ADDB, and outputs to the redundancy IO multiplexer coding section 144 the common signals ENP, EQN, ENW<n>, CPL and ENN, and a fail IO number FION<r>.

Here, the fail IO number FION<r> is a signal for selecting only one IO among the plurality of IOs processed in parallel.

Meanwhile, the programmable redundancy coding section 143 stores the fail column address in the redundancy coding cell, and if the input address corresponds to the fail column address, it outputs a control signal for the redundancy operation. The programmable redundancy coding section receives the common signals ENP, EQN, CPL, ENN and ENW<n>, the set signal, the reset signal and the PREC signal inputted from the state diagram generating section 142, outputs the RPUL<n> signals to the redundancy IO multiplexer coding section 144, and outputs the RIODIS signal to the normal IO path section 146.

At this time, if the reset signal becomes 'high', the programmable redundancy coding section outputs the WLRHR<n> signals for storing the present column address in the redundancy cells to the redundancy IO amplifying section of the core mat section 145.

The normal IO path section 146 enables a normal data read/write from/in the main cell array section by connecting IO<r> signals of the data input/output buffer section 147 with MIO<r> signals of the core mat section 145 according to the RIODIS signal.

Also, the redundancy IO multiplexer coding section 144 receives RPUL<n> signals, FOIN<r> signals and common signals ENP, EQN, ENW<n> and ENN from the state diagram generating section 142, and relieves the corresponding fail IO.

That is, the redundancy IO multiplexer coding section 144 performs the read/write of the fail IO data through the redundancy cell array section in a manner that it connects one portion of the IO<r> corresponding to the normal address with the MIO<r>, and connects the other portion of the IO<r> corresponding the fail address with the RIO<q>.

Next, the construction of the core mat section 145 will be explained.

Figure 15:
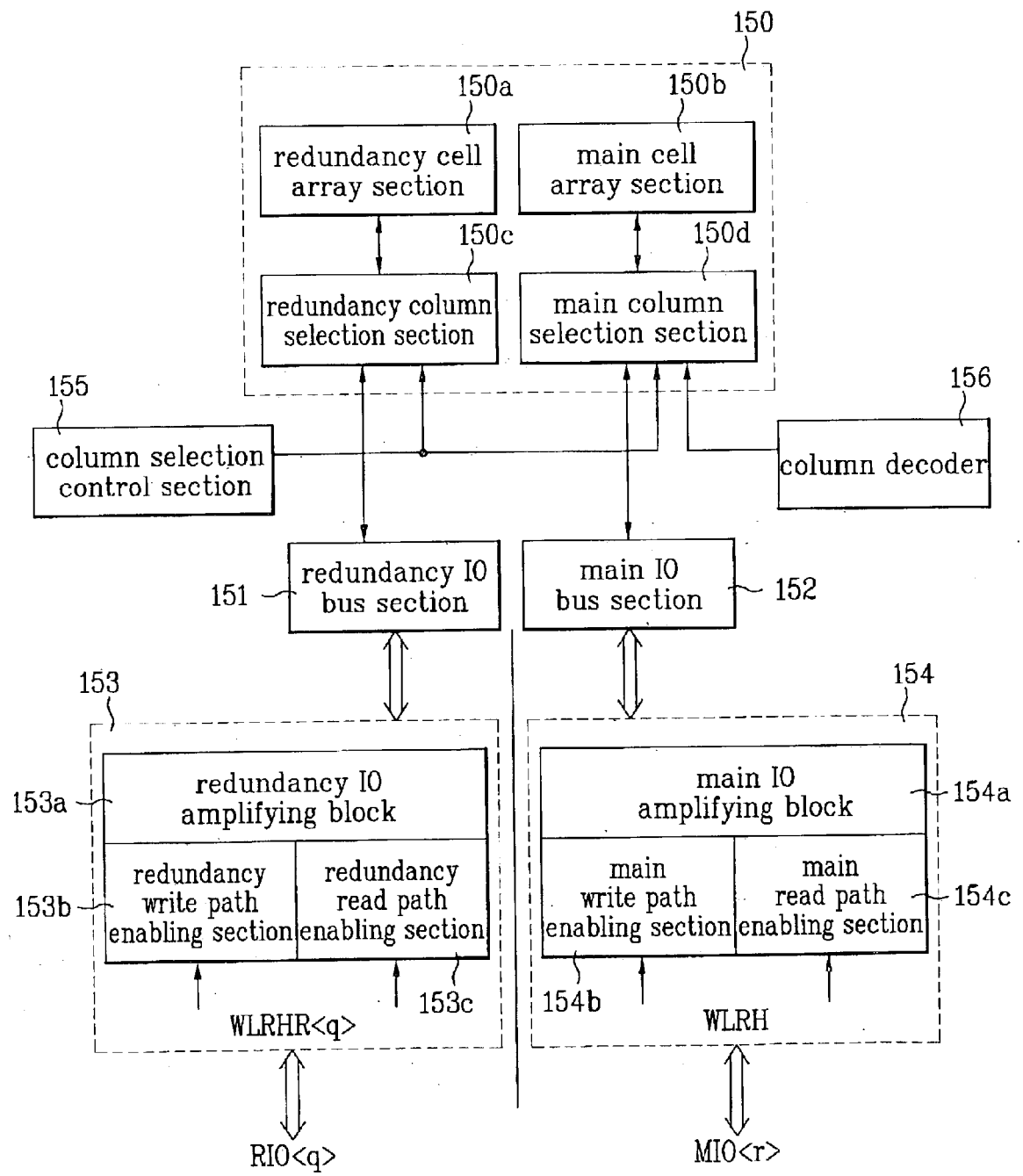
FIG. 15 is a block diagram of a core mat section of FIG. 14.

FIG. 15 is a block diagram of the core mat section of FIG. 14.

The core mat section 145, as shown in FIG. 15, includes a one-cell array section 150, a redundancy IO bus section 151, a main IO bus section 152, a redundancy amplifying section 153, a main amplifying section 154, a column selection control section 155, and a column decoder 156.

The one-cell array section 150 includes a redundancy cell array section 150a, a main cell array section 150b, a redundancy column selection section 150c, and a main column selection section 150d.

The redundancy column selection section 150c is selected when all column bit lines are selected by the column selection control section 155 without receiving the signal of the column decoder 156.

Accordingly, in a read mode, the redundancy data is not changed, but in a write mode, the redundancy data may be changed. Accordingly, in the column address where the redundancy is inactivated, the redundancy amplifying section 153 is operated in the read mode.

The redundancy amplifying section 153 operates by receiving the WLRHR<q> signals, while the main amplifying section 154 operates by receiving the normal WLRH signals.

The redundancy amplifying section includes a redundancy IO amplifying block 153a, a redundancy write path enabling section 153b, and a redundancy read path enabling section 153c. The main amplifying section 154 includes a main IO amplifying block 154a, a main write path enabling section 154b, and a main read path enabling section 154c.

The WLRH signals become 'high' in the write mode, and become 'low' in the read mode. If the WLRH signals become 'high', the main write path enabling section 154b is enabled, and the data of MIO<r> is written in the main cell array section 150b. If the WLRH signals become 'low', the main read path enabling section 154c is enabled, and the data stored in the main cell array section 150b is read out.

Also, the WLRHR is normally operated in case of the corresponding fail column address, that is, in the read mode, it becomes 'high', and in the write mode, it becomes 'low'.

Accordingly, if the WLRHR is in a 'high' state, the redundancy write path enabling section 153b is enabled, and the data of RIO<q> is written in the redundancy cell array section 150b. If the WLRHR is in a 'low' state, the redundancy read path enabling section 153c is enabled, and the data of RIO<q> is read out.

However, if a normal column address where the fail is not produced, the WLRHR becomes 'high' in both the read mode and the write mode, and only the redundancy read path enabling section 163c is always activated to operate in the read mode, thereby protecting the data of the redundancy cells.

The state diagram generating section 143 is the same as the state diagram generating section 53 according to the first embodiment of the present invention, which will be explained later.

Next, the construction and operation of the programmable redundancy coding section 143, the redundancy IO multiplexer coding section 144, and the normal IO path section 146 will be explained.

The programmable redundancy coding section 143 uses the redundancy cells constructed including the ferroelectric capacitors.

Figure 16:
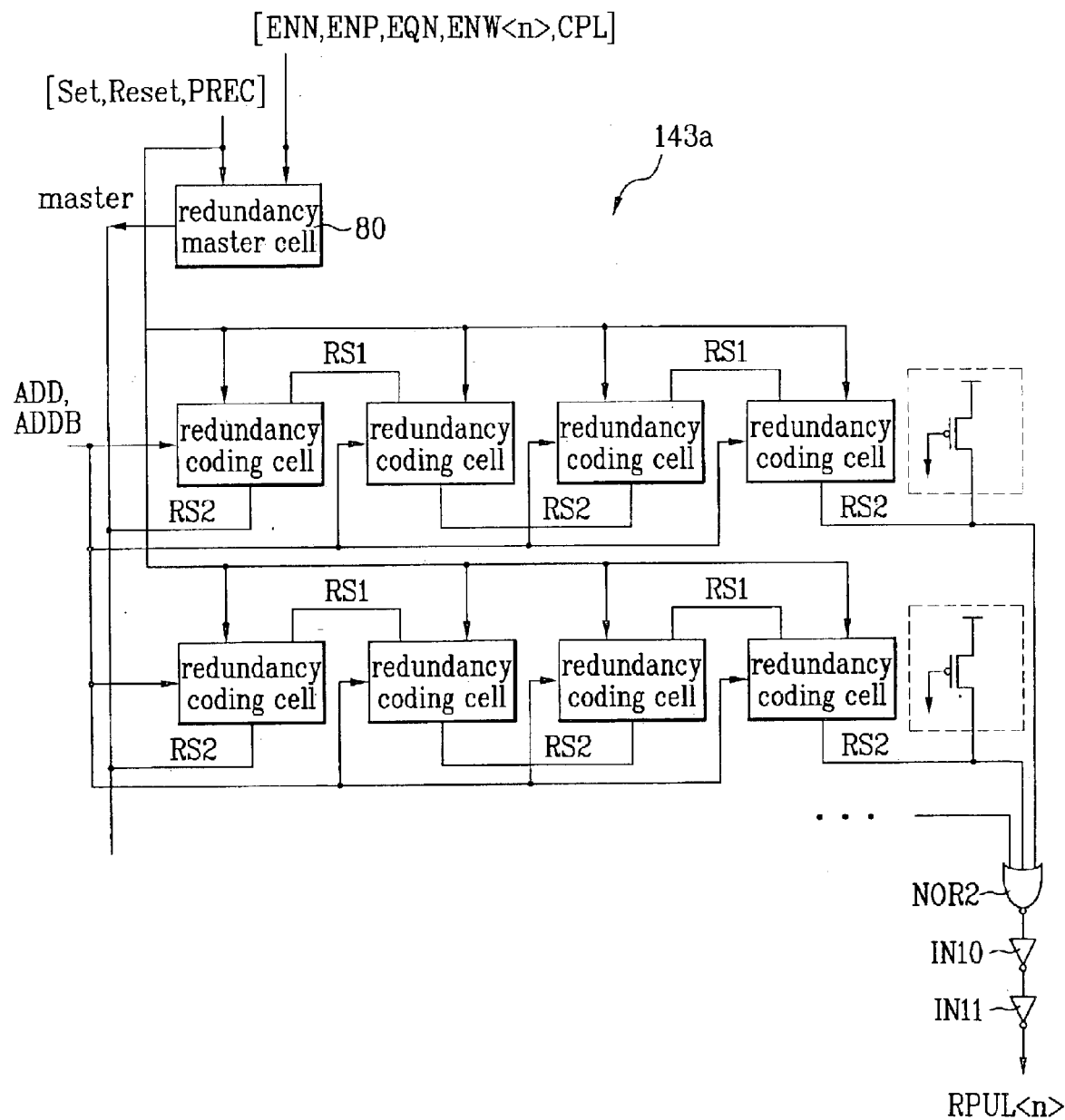
FIG. 16 is a block diagram of a unit redundancy coding section of a programmable redundancy coding section.
Figure 17:
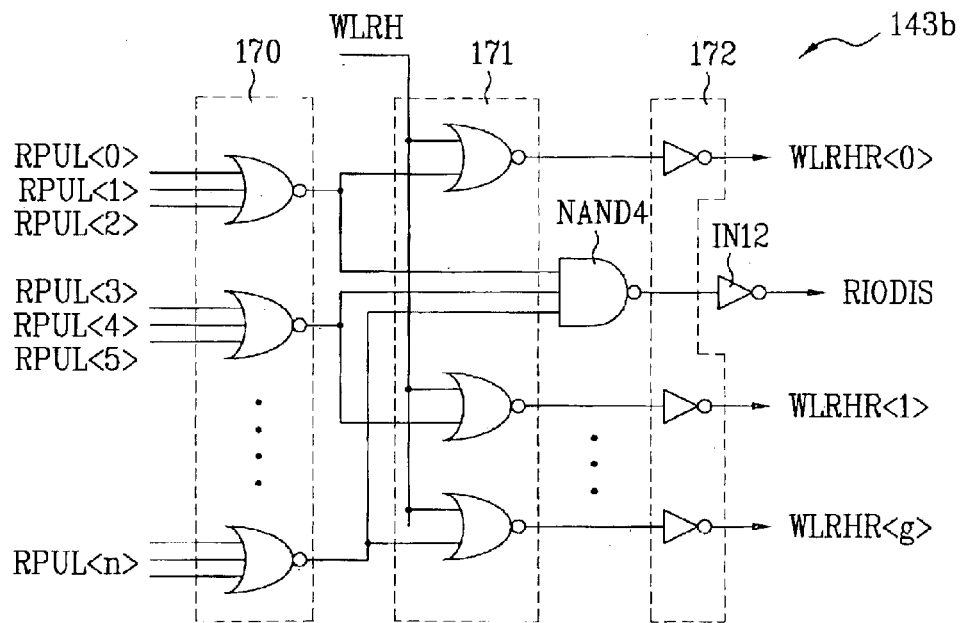
FIG. 17 is a circuit diagram of a redundancy control section of a programmable redundancy coding section.

FIG. 16 is a block diagram of the unit redundancy coding section 143a constituting the programmable redundancy coding section 143, and FIG. 17 is a circuit diagram of the redundancy control section 143b.

The programmable redundancy coding section is composed of a plurality of unit redundancy coding sections 143a and redundancy control section 143b.

The unit redundancy coding section 143a, as shown in FIG. 16, includes two kinds of redundancy cells, i.e., a redundancy master cell 160 and a plurality of redundancy coding cells 161, a second NOR gate NOR2 for receiving and NOR-gating output signals according to on/off states of the redundancy coding cells 161, a tenth inverter IN10 for inverting an output signal of the second NOR gate NOR2, an eleventh inverter IN11 for inverting the output signal of the tenth inverter IN10 and outputting the RPUL<n> signals, and PMOS transistors connected to final output terminals of the plurality of redundancy coding cells connected together in a column direction.

The redundancy master cell 160 outputs a master signal for determining whether to activate or inactivate the operation of the whole redundancy coding cells. The redundancy coding cells 161 are arranged by groups in a column direction to transfer the master signal (in the embodiment, four redundancy coding cells per group are arranged in the column direction).

The first redundancy coding cell among the four redundancy coding cells arranged in the column direction receives the master signal through an RS2 line, and the first and second redundancy coding cells are connected through the RS1. The second and third redundancy coding cells are connected through the RS2, and the third and fourth coding cells are connected through the RS1.

Whether the master signal is transferred through one input terminal of the second NOR gate NOR2 is determined by the connection state of the RS1 and RS2 according to the operation of the four redundancy coding cells arranged in the column direction. The PMOS transistors are connected between final output terminals of the redundancy coding cells connected in the column direction to transfer the master signal and a power supply voltage terminal Vcc, and receive the ground level voltage Vss, respectively.

The redundancy master cell 160 receives the common signals ENP, EQN, ENW<n>, CPL and ENN outputted from the state diagram generating section 142, the PREC signal, the set signal and the reset signal, and in a default state, it is inactivated to output a 'high' level master signal, while in an active state, it outputs a 'low' level master signal.

Also, the redundancy coding cells 161 serve to store the fail address.

If the corresponding fail address is inputted as an input address ADD in a that the fail address is stored, the RS1 and RS2 are in a connected state to each other to make current flow therethrough, while if the input address is not the corresponding fail address, the RS1 and RS2 are in an open state to make current not flow therethrough.

Accordingly, only when all the redundancy coding cells 161 are in an 'on' state, the REN<n> signals are outputted with a 'high' level, while otherwise, the REN<n> signals are outputted with a 'low' level.

As described above, only one RPUL<n> signal is outputted from the unit address coding cell 54a.

A 'high' level RPUL<n> signal, as shown in FIG. 17, is used to activate the WLRHR<q> signal and the RIODIS signal through the redundancy control section 143b.

Here, the WLRHR<q> signal is for the normal operation of the read/write mode when the redundancy path is used in the corresponding fail bit address.

The RIODIS signal is a control signal that becomes 'low' in case of using the redundancy, and becomes 'high' in case of the normal column operation. The control operation by the RIODIS signal will be explained later.

Next, the redundancy control section 143b will be explained.

The redundancy control section 143b, as shown in FIG. 17, includes a second NOR gate section 170 composed of a plurality of 3-input NOR gates, a third NOR gate section 171 composed of 2-input NOR gates which correspond to the NOR gates constituting the second NOR gate section 170 in a one-to-one manner, receive and NOR-gating output signals of the respective NOR gates and the WLRH signal, a first inverter section 172 composed of inverters which correspond to the NOR gates constituting the third NOR gate section 171 in a one-to-one manner, and inverting output signals of the corresponding NOR gates, a fourth NAND gate NAND1 for NAND-gating the output signals of the NOR gates of the second NOR gate section 170, and a twelfth inverter IN12 for inverting an output signal of the fourth NAND gate NAND4 and outputting the RIODIS signal.

The RPUL<n> signals inputted to the redundancy control section 143b are used to control the plurality of IOs to use different redundancy amplifiers, respectively, in case of the same cell array region or in case of retrieving the IOs in one column address.

That is, as shown in FIG. 17, one fail IO is allocated to a group of RPUL<0>, RPUL<1> and RPUL<2>, and another fail IO is allocated to a group of RPUL<3>, RPUL<4> and RPUL<5>.

Meanwhile, in case of the different cell array regions or in case of retrieving one IO in one column address, the respective IOs can use the same redundancy amplifier.

Next, the redundancy IO multiplexer coding section 144 will be explained.

Figure 18:
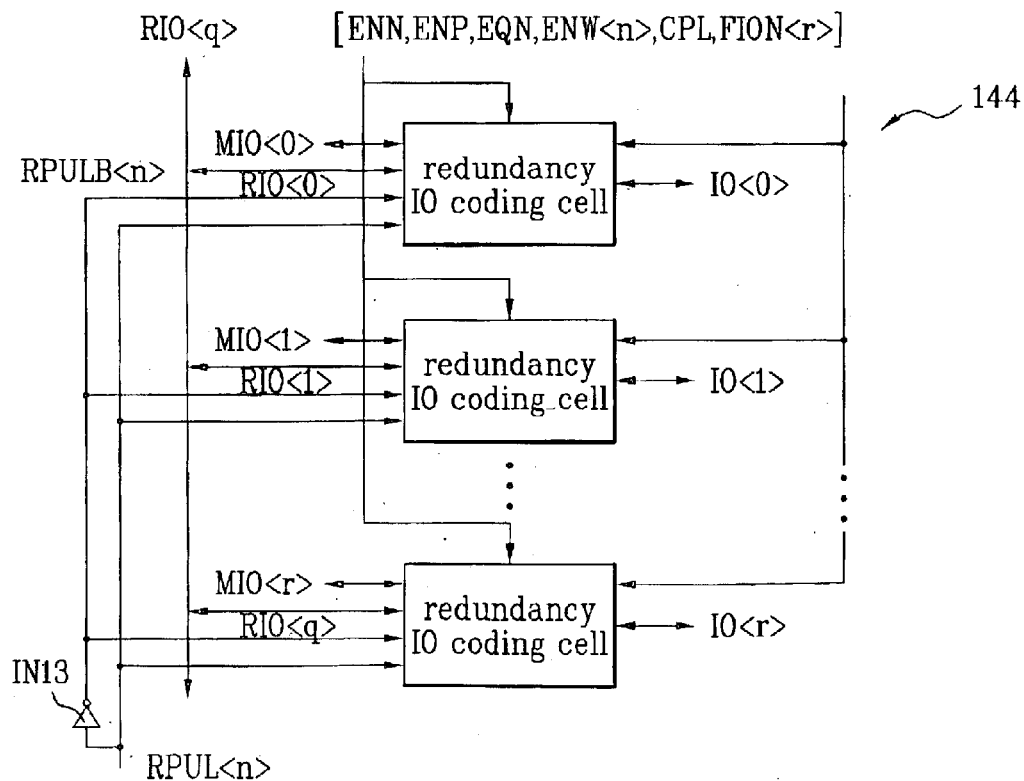
FIG. 18 is a circuit diagram of a redundancy IO multiplexer coding section.
Figure 19:
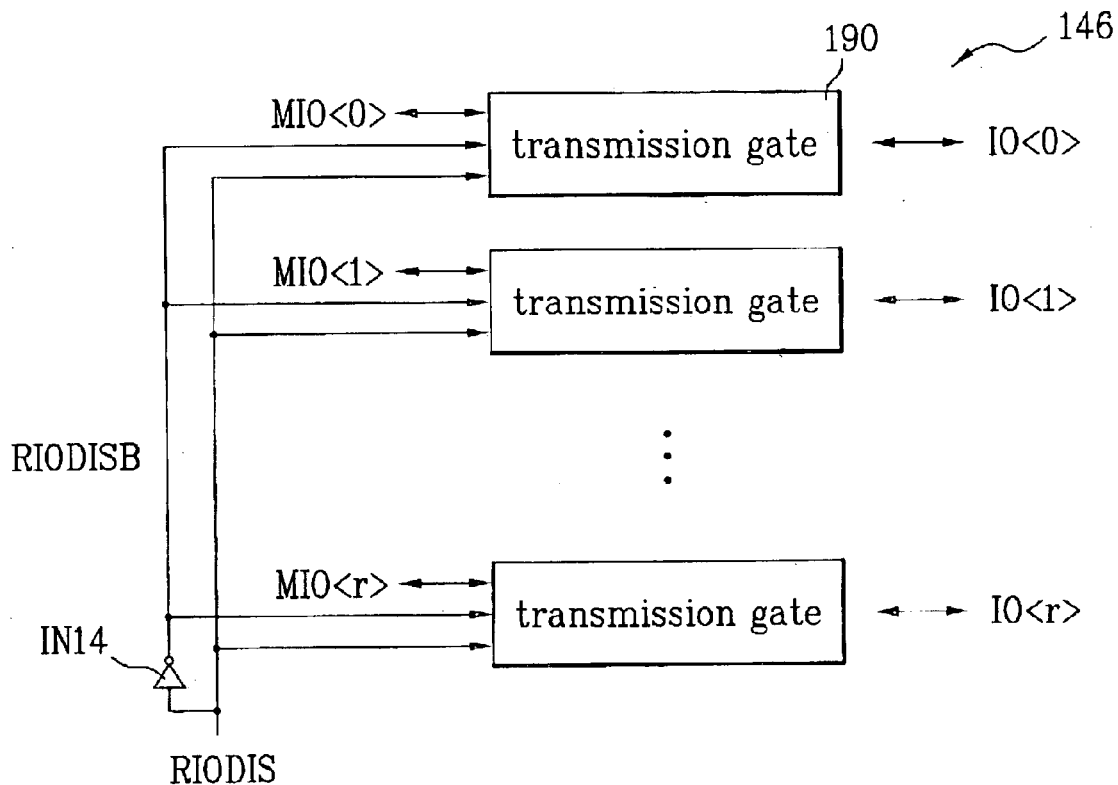
FIG. 19 is a block diagram of a normal IO path section.
Figure 20:
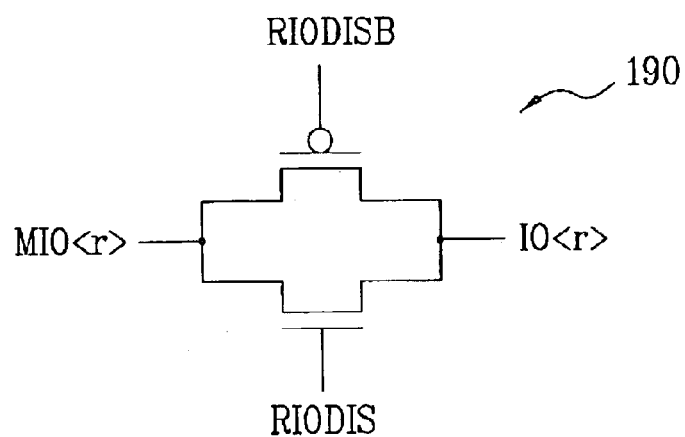
FIG. 20 is a circuit diagram of a transmission gate of FIG. 19.

FIG. 18 is a circuit diagram of the redundancy IO multiplexer coding section, FIG. 19 is a block diagram of the normal IO path section, and FIG. 20 is a circuit diagram of a transmission gate of FIG. 19.

The redundancy IO multiplexer coding section 144, as shown in FIGS. 14 and 18, includes a plurality of redundancy IO coding cells 181 for receiving the ENW<n>, ENN, ENP, EQN, CPL and RPUL<n>, and the FOIN<r> and connecting the IO<r> bus with the MIO<r> bus or RIO<q> bus, and thirteenth inverter IN13 for inverting the RPUL<n> and outputting the RPULB<n> to the redundancy IO coding cells 181.

At this time, the MIO<r> is a main data bus of which the number of normal IO bus widths is 'r', and the RIO<q> is a redundancy data bus of which the number of redundancy IO bus widths is 'q'.

The IO<r> denotes the data input/output buffer width, and has the same width as the MIO<r>.

The redundancy IO multiplexer coding section 144 is a basic IO multiplexer whereby one among the 'q' RIOs is used as the redundancy.

That is, one among the 'r' MIO<r> is replaced by the RIO<r>, and is connected with the IO<r>.

Also, if the RPUL<n> appears to be in a 'high' level in case of the corresponding fail column address, the MIO<r> is connected with the IO<r> or the RIO<q> is connected with the IO<r> in accordance with the state of the respective redundancy IO coding cell 181.

As described above, the redundancy IO multiplexer coding section 144 performs a normal operation when the corresponding fail column address is inputted. However, if the normal column address is inputted, the RPUL<n> becomes 'low', and all the RIO<q> and the MIO<r> are disconnected from the IO<r>, so that the redundancy IO multiplexer coding section 144 is inactivated.

Next, the construction of the normal IO pass section 146 that performs a normal mode operation when the normal column address is inputted will be explained.

The normal IO pass section 146, as shown in FIG. 19, includes a plurality of transmission gates 190 for receiving the RIODIS signal and the RIODISB signal and determining whether to connect the MIO<r> bus and the IO<r> bus, and a fourteenth inverter IN14 for inverting the. RIODIS signal and outputting the RIODISB signal.

The respective transmission gate 190, as shown in FIG. 20, includes an NMOS transistor having a gate to which the RIODIS signal is inputted, and a PMOS transistor having a gate to which the RIODISB signal is inputted. Both terminals of the NMOS transistor and the PMOS transistor are connected together, and the MIO<r> and the IO<r> are connected to the both terminals connected together.

In case of using the redundancy, the RIODIS signal becomes 'low', and inactivates the transmission gate, while in case of a normal column operation, it becomes 'high', and activates the transmission gate 190 to connect the MIO<r> bus and the IO<r> bus together.

Next, the circuit construction of the redundancy master cell 160 and the unit redundancy coding cells 161 which constitute the unit redundancy coding section 143a of FIG. 16, and the IO coding cells 190 of FIG. 18 will be explained.

The redundancy master cell 160 receives the common signals ENN, ENP, EQN, CPL and ENW<n>, the PREC signal, the set signal and the reset signal, and determines the output of the master signal. The redundancy coding cell 161 receives the common signals ENN, ENP, EQN, CPL and ENW<n>, the ADD signal and the ADDB signal, and determines the connection/disconnection of the RS1 and RS2 lines.

Figure 21:
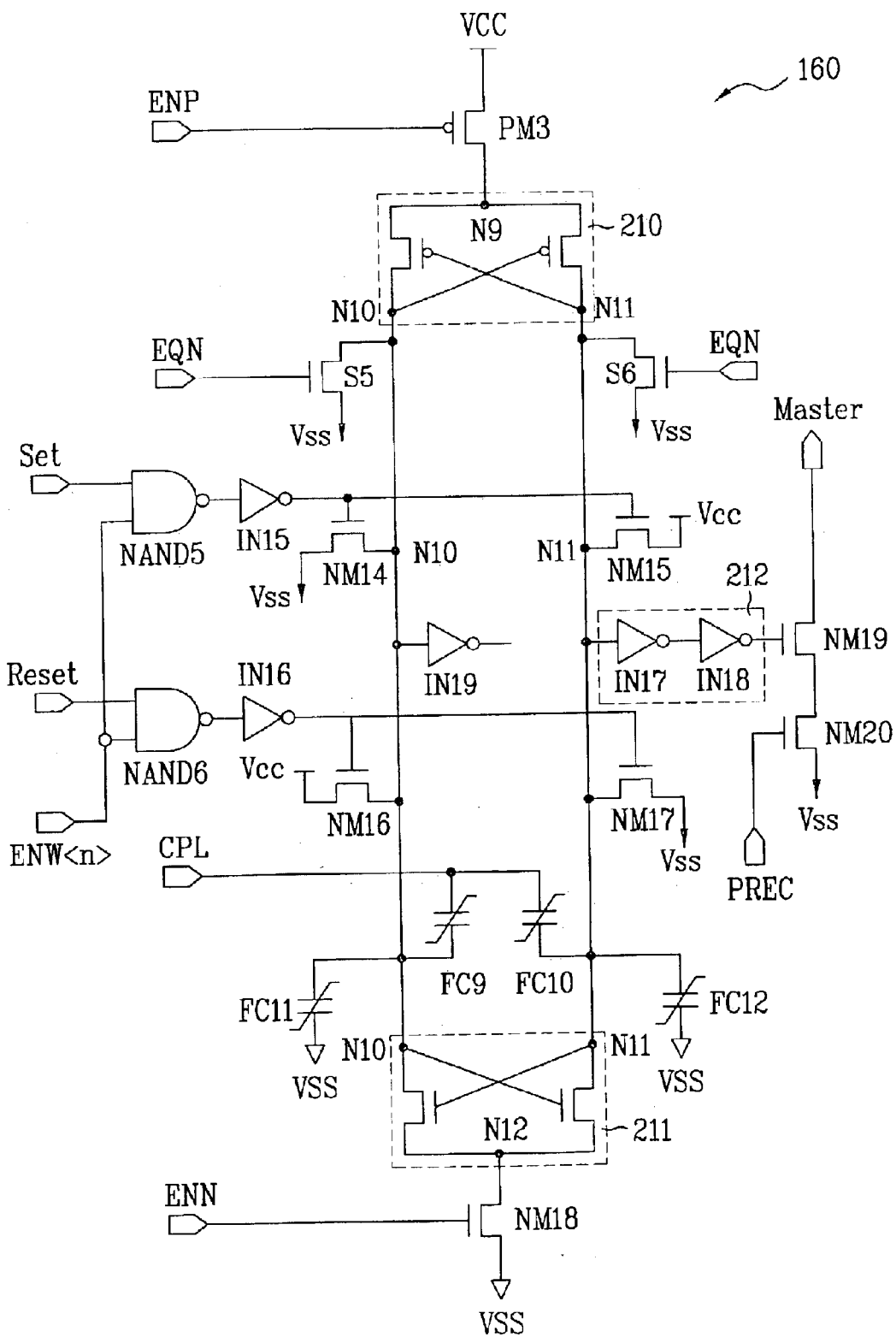
FIG. 21 is a circuit diagram of a redundancy master cell of FIG. 16.
Figure 22:
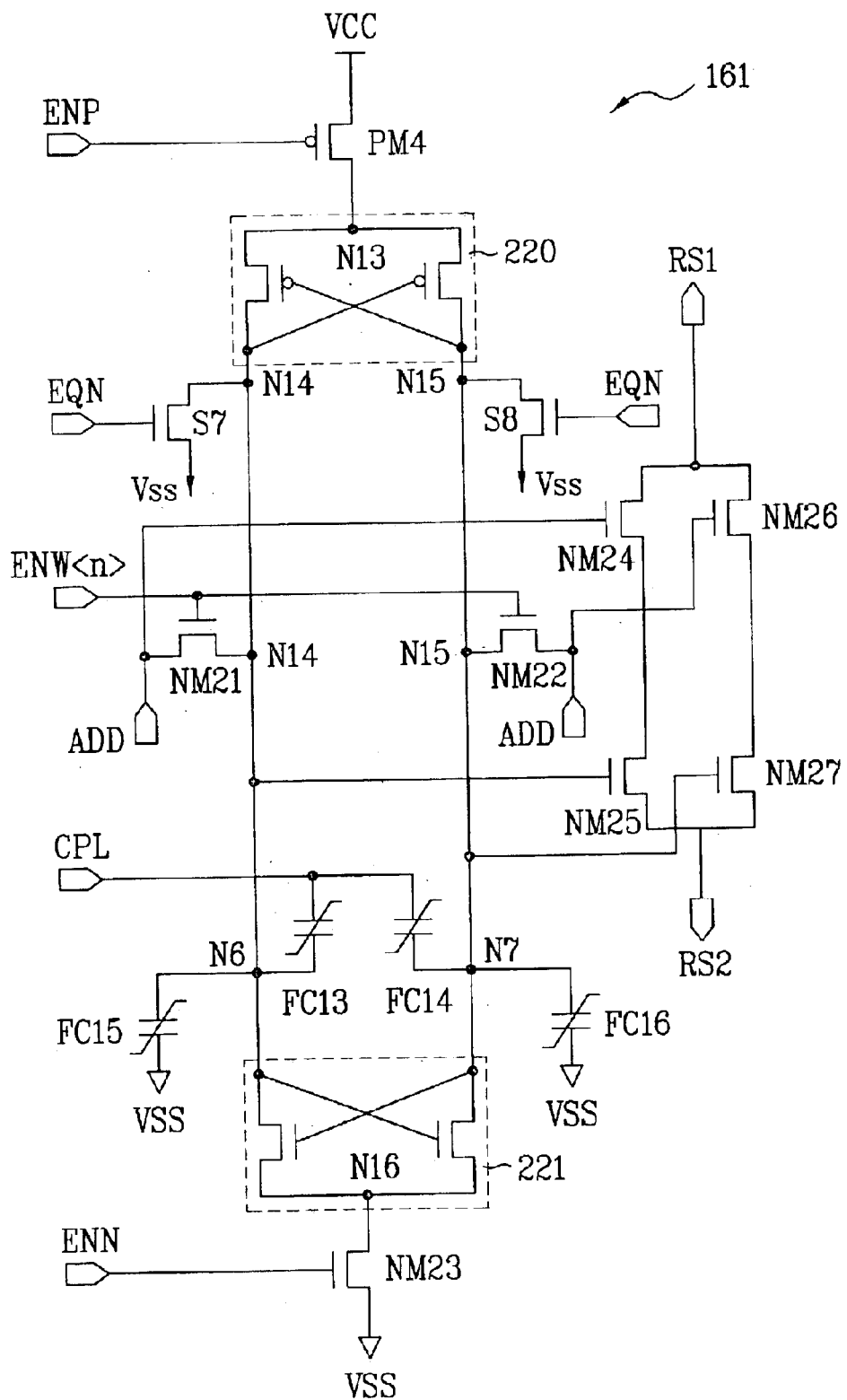
FIG. 22 is a circuit diagram of a redundancy coding cell of FIG. 16.
Figure 23:
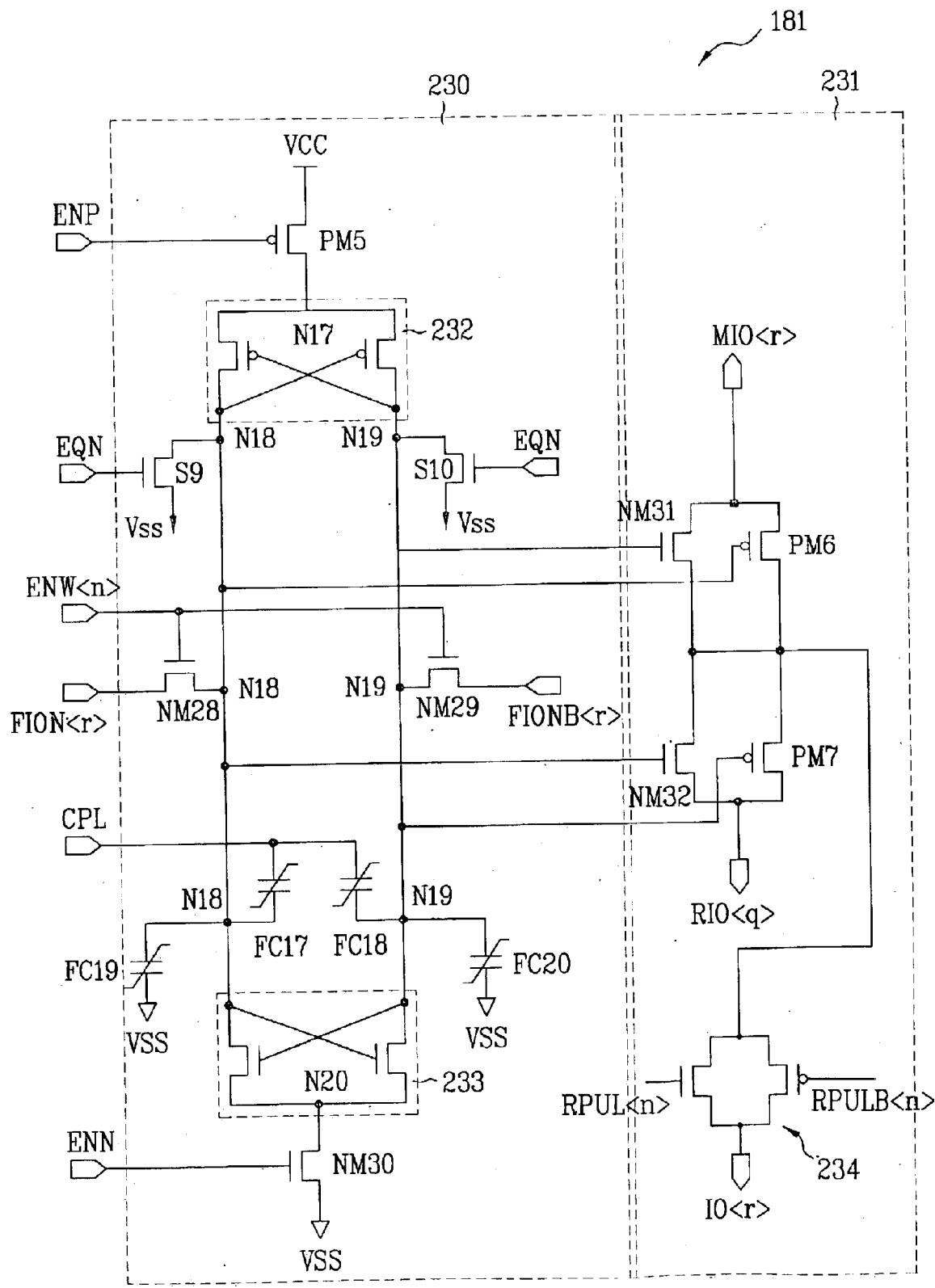
FIG. 23 is a circuit diagram of a redundancy IO coding cell.

FIG. 21 is a circuit diagram of the redundancy master cell 160 of FIG. 16, FIG. 22 is a circuit diagram of the redundancy coding cell, and FIG. 23 is a circuit diagram of the redundancy IO coding cell.

The redundancy master cell 160, as shown in FIG. 21, receives the common signals ENN, ENP, EQN, CPL and ENW<n>, the PREC signal, the set signal and the reset signal, and determines the output of the master signal.

The redundancy master cell 60 includes a third PMOS transistor PM3 for receiving a PMOS enable signal ENP and transferring a power supply voltage Vcc to a ninth node N9, a fifth latch 210 one node of which is connected to the ninth node N9 and the other node of which is connected to tenth and eleventh nodes N10 and N11, fifth and sixth NMOS switches S5 and S6 for receiving an equalizer signal EQN and applying a ground voltage Vss to the tenth and eleventh nodes N10 and N11, respectively, a fifth NAND gate NAND5 for NAND-gating the set signal and the ENW<n> signals from the state diagram generating section 142, a fifteenth inverter IN15 for inverting an output signal of the fifth NAND gate NAND5, a sixth NAND gate NAND6 for NAND-gating the reset signal and the ENW<n> signals from the state diagram generating section 142, a sixteenth inverter IN16 for inverting an output signal of the sixth NAND gate NAND6, a fourteenth NMOS transistor NM14 a gate of which an output signal of the fifteenth inverter IN15 is inputted to, one terminal of which a signal of the tenth node N10 is transferred to, and the other terminal of which is connected to a terminal of the ground voltage Vss, a fifteenth NMOS transistor NM15 a gate of which the output signal of the fifteenth inverter IN15 is inputted to, one terminal of which a signal of the eleventh node N11 is transferred to, and the other terminal of which is connected to a terminal of the DC voltage Vcc, a sixteenth NMOS transistor NM16 a gate of which an output signal of the sixteenth inverter IN16 is inputted to, one terminal of which the signal of the tenth node N10 is transferred to, and the other terminal of which is connected to the terminal of the power supply voltage Vcc, a seventeenth NMOS transistor NM17 a gate of which the output signal of the sixteenth inverter IN16 is inputted to, one terminal of which the signal of the eleventh node N11 is transferred to, and the other terminal of which is connected to the terminal of the ground voltage Vss, an eighteenth NMOS transistor NM18 for receiving an NMOS enable signal ENN and transferring the ground voltage Vss to a twelfth node N12, a sixth latch 211 one node of which is connected to the twelfth node N12 and the other node of which is connected to the tenth and eleventh nodes N10 and N11, a ninth ferroelectric capacitor FC9 connected between an input node of the CPL signal and the tenth node N10, a tenth ferroelectric capacitor FC10 connected between the input node of the CPL signal and the eleventh node N11, a eleventh ferroelectric capacitor FC11 connected between the tenth node N10 and the terminal of the ground voltage Vss, a twelfth ferroelectric capacitor FC12 connected between the eleventh node N11 and the terminal of the ground voltage Vss, seventeenth and eighteenth inverters IN17 and IN18, a second delay section 212 for delaying the output of the eleventh node N11 for a predetermined time period, a nineteenth inverter IN19, connected to the tenth node N10, for matching loading of the tenth node N10 with respect to the seventeenth and eighteenth inverters IN17 and IN18 connected to the eleventh node N11, and nineteenth and twentieth NMOS transistors NM19 and NM20, connected in series between a master signal output terminal and the terminal of the ground voltage Vss, for being controlled by an output signal of the second delay section 212 and the PREC signal.

The fifth latch 210 is composed of two PMOS transistors, and the sixth latch 211 is composed of two NMOS transistors.

In the ninth and tenth ferroelectric capacitors FC9 and FC10 are always stored data opposite to each other, and the eleventh and twelfth ferroelectric capacitors FC11 and FC12 serve as capacitance loading devices required when sensing and reading out the stored data.

The redundancy master cell 160 receives and operates by the common signals ENN, ENP, EQN, CPL and EWN<n> from the state diagram generating section 142, but receives the PREC signal and the master signal through different paths.

In case of using the redundancy, a 'high' level set signal and a 'low' level reset signal are inputted from the state diagram generating section 142, and this makes the fourteenth and fifteenth NMOS transistors NM14 And NM15 turned on and the sixteenth and seventeenth NMOS transistors NM16 and NM17 turned off. Thus, the tenth node N10 and the eleventh node N11 are in a 'low' level state and in a 'high' level state, respectively.

Accordingly, the 'high' level signal of the eleventh node N11 is outputted through the second delay section 212, and turns on the nineteenth NMOS transistor NM19.

The PREC signal goes to a 'high' level in an active region, and activates the master signal with a 'low' level by turning on the twentieth NMOS transistor NM20, but in a pre-charge region, it goes to a 'low' level, and inactivates the master signal with a 'high' level by turning off the twentieth NMOS transistor NM20.

Also, in case that the redundancy is not used, a 'low' level set signal and a 'high' level reset signal are inputted from the state diagram generating section 142, and this makes the fourteenth and fifteenth NMOS transistors NM14 And NM15 turned off and the sixteenth and seventeenth NMOS transistors NM16 and NM17 turned on. Thus, the signal of the eleventh node N11 are in a 'low' level state.

Accordingly, the 'low' level signal of the eleventh node N11 is outputted through the second delay section 212, and turns off the nineteenth NMOS transistor NM19 to inactivate the master signal with a 'high' level.

Meanwhile, the redundancy coding cell 161, as shown in FIG. 22, receives the common signals ENN, ENP, EQN, ENW<n> and CPL, and the first and second addresses ADD and ADDB, and determines the connection/disconnection of the RS1 And the RS2.

In the redundancy coding cell 161 is stored the address of the fail column, and if the first and second addresses ADD and ADDB correspond to the stored address of the fail column, it connects the RS1 and the RS2 together.

The redundancy coding cell includes a fourth PMOS transistor PM4 for receiving a PMOS enable signal ENP and transferring the power supply voltage Vcc to a thirteenth node N13, a seventh latch 220 one node of which is connected to the thirteenth node N13 and the other node of which is connected to fourteenth and fifteenth nodes N14 and N15, seventh and eighth switches S7 and S8 for receiving an equalizer signal EQN and applying a ground voltage Vss to the fourteenth and fifteenth nodes N14 and N15, respectively, a twenty-first NMOS transistor NM21 a gate of which the ENW<n> signals are inputted to, one terminal of which a signal of the fourteenth node N14 is transferred to, and the other terminal of which a first address ADD is applied to a twenty-second NMOS transistor NM22 a gate of which the ENW<n> signals are inputted to, one terminal of which a signal of the fifteenth node N15 is transferred to, and the other terminal of which a second address ADDB is applied to, a twenty-third NMOS transistor NM23 for receiving an NMOS enable signal ENN and transferring the ground voltage VSS to the sixteenth node N16, an eighth latch 221 one node of which is connected to the sixteenth node N16 and the other node of which is connected to the fourteenth and fifteenth nodes N14 and N15, a thirteenth ferroelectric capacitor FC13 connected between an input terminal of the CPL signal and the fourteenth node N14, a fourteenth ferroelectric capacitor FC14 connected between the input terminal of the CPL signal and the fifteenth node N15, a fifteenth ferroelectric capacitor FC15 connected between the fourteenth node N14 and the terminal of the ground voltage Vss, a sixteenth ferroelectric capacitor FC16 connected between the fifteenth node N15 and the terminal of the ground voltage Vss, twenty-fourth and twenty-sixth NMOS transistors NM24 and NM26 which are determined to be turned on/off by the address signals ADD and ADDB, and twenty-fifth and twenty-seventh NMOS transistors NM25 and NM27 which are determined to be turned on/off under the control of signals of the fourteenth node NM14 and the fifteenth node N15.

According to the construction as described above, if the twenty-fourth NMOS transistor NM24 and the twenty-sixth NMOS transistor NM26 are turned on, or the twenty-fifth NMOS transistor NM25 and the twenty-seventh NMOS transistor NM27 are turned on, the RS1 and the RS2 are connected together.

The seventh latch 220 is composed of two PMOS transistors, and the eighth latch 221 is composed of two NMOS transistors.

In the thirteenth and fourteenth ferroelectric capacitors FC13 and FC14 are always stored data opposite to each other, and the fifteenth and sixteenth ferroelectric capacitors FC15 and FC16 serve as capacitance loading devices required when sensing and reading out the stored data.

The RS1 and RS2 are nodes for outputting to the outside what fail address is stored in the redundancy coding cell 161.

For example, if the fail address is 'high', the first address ADD becomes 'high', and the second address ADDB becomes 'low'.

If the twenty-first and twenty-second NMOS transistors NM21 and NM22 are turned on by the ENW<n> signals, 'high' level data and 'low' level data are stored in the thirteenth and fourteenth ferroelectric capacitors FC13 and FC14, respectively, and the fail column address is stored in the redundancy coding cells 161.

Thereafter, if the corresponding fail address is inputted after the redundancy coding, the fourteenth node N14 and the first address ADD are in a 'high' level state, and the twenty-fourth NMOS transistor NM24 and the twenty-fifth NMOS transistor NM25 are turned on, so that the RS1 and the RS2 are in a low-resistance state that current can flow therethrough.

On the contrary, if an address that is not the corresponding fail address is inputted, the fourteenth node N14 becomes 'high', and the first address ADD becomes 'low'. Thus, the twenty-fourth NMOS transistor NM24 is turned off, and the twenty-fifth NMOS transistor NM25 is turned on, so that the RS1 and The RS2 are in a fixed-resistance state that no current can flow therethrough.

Next, if the fail address is in a 'low' state, the first address ADD becomes 'low', and the second address ADDB becomes 'high'.

If the twenty-first and twenty-second NMOS transistors NM21 and NM22 are turned on by the ENW<n> signals activated as the 'high' level, 'low' level data and 'high' level data are stored in the thirteenth and fourteenth ferroelectric capacitors FC13 and FC14, respectively, and the fail column address is stored in the redundancy coding cells 61.

Thereafter, if the corresponding fail address is inputted, the fifteenth node N15 and the second address ADDB are in 'high' level state, and the twenty-sixth and twenty-seventh NMOS transistors NM26 and NM273 are turned on, so that the RS1 and the RS2 are in a low-resistance state that current can flow therethrough.

On the contrary, if an address that is not the corresponding fail address is inputted, the fifteenth node N15 becomes 'high', but the second address ADDB becomes 'low'. Thus, the twenty-sixth NMOS transistor NM26 is turned off, and the twenty-seventh NMOS transistor NM27 is turned on, so that the RS1 and The RS2 are in a fixed-resistance state that no current can flow therethrough.

Accordingly, only when the fail column address stored in the redundancy coding cells is inputted as the input address, the activated master signal is transferred to the input terminal of the second NOR gate NOR2.

Next, the construction of the redundancy IO coding cell 181 will be explained.

The redundancy IO coding cell 181 as shown in FIG. 23, is composed of an IO write section 230 and a fail IO switch section 231. The redundancy IO coding cell 181 receives the common signals ENN, ENP<, EQN, CPL and ENW<n>, FION<r> and FIOB<r>, and determines the connection/disconnection of the MIO<r> and the RIO<q>.

First, the fail IO write section 230 includes a fifth PMOS transistor PM5 for receiving a PMOS enable signal ENP and transferring the power supply voltage Vcc to a seventeenth node N17, a ninth latch 232 one node of which is connected to the seventeenth node N17 and the other node of which is connected to eighteenth and nineteenth nodes N18 and N19, ninth and tenth NMOS switches S9 and S10 for receiving an equalizer signal EQN and applying a ground voltage Vss to the eighteenth and nineteenth nodes N18 and N19, respectively, a twenty-eighth NMOS transistor NM28 a gate of which the ENW<n> signal is inputted to, one terminal of which a signal of the eighteenth node N18 is transferred to, and the other terminal of which a fail IO number FION<r> is inputted to, a twenty-ninth NMOS transistor NM29 a gate of which the ENW<n> signal is inputted to, one terminal of which a signal of the nineteenth node N19 is transferred to, and the other terminal of which a fail IO number FIONB<r> is inputted to, a thirtieth NMOS transistor NM30 for receiving an NMOS enable signal ENN and transferring the ground voltage Vss to the twentieth node N20, a tenth latch 233 one node of which is connected to the twentieth node N20 and the other node of which is connected to the eighteenth and nineteenth nodes N18 and N19, a seventeenth ferroelectric capacitor FC17 connected between an input terminal of the CPL signal and the eighteenth node N18, an eighteenth ferroelectric capacitor FC18 connected between the input terminal of the CPL signal and the nineteenth node N19, a nineteenth ferroelectric capacitor FC19 connected between the eighteenth node N18 and the terminal of the ground voltage Vss, and a twentieth ferroelectric capacitor FC20 connected between the nineteenth node N19 and the terminal of the ground voltage Vss.

Meanwhile, the fail IO switch section 231 includes a sixth PMOS transistor PM6 and a thirty-first NMOS transistor NM31 which are determined to be turned on/off by a signal of the eighteenth node N18, a thirty-second NMOS transistor NM31 and a seventh PMOS transistor PM7 which are determined to be turned on/off by a signal of the nineteenth node N19, and a first transmission gate 234 for receiving the RPUL<n> signal and the RPULB<n> signal and connecting one of the MIO<r> bus and the RIO<q> bus with the IO<r> bus.

According to the construction as described above, the thirty-first NMOS transistor NM31 is always disconnected from the thirty-second NMOS transistor NM32, and the sixth PMOS transistor PM6 is always disconnected from the seventh PMOS transistor PM7.

That is, by the operation of the first transmission gate 234, either of the MIO<r> and the RIO<q> is connected with the IO.

The ninth latch 232 is composed of two PMOS transistors, and the tenth latch 233 is composed of two NMOS transistors.

As described above, in the seventeenth and eighteenth ferroelectric capacitors FC17 and FC18 are always stored data opposite to each other, and the nineteenth and twentieth ferroelectric capacitors FC19 and FC20 serve as capacitance loading devices required when sensing and reading out the stored data.

Next, the construction and operation of the state diagram generating sections 54 and 142 according to the first and second embodiments of the present invention will be explained.

The state diagram generating sections according to the present invention output signals so that data is written in the redundancy cells in case that the input address satisfies the condition encrypted by the user.

The state diagram generating section 53 according to the first embodiment of the present invention outputs to the programmable redundancy coding section 54 the common signals ENP, EQN, ENN, CPL and ENW<n>, the PREC signal, the set signal and the reset signal.

Meanwhile, the state diagram generating section 142 according to the second embodiment of the present invention outputs to the programmable redundancy coding section 143 the common signals ENP, EQN, CPL, ENW<n> and ENN, the PREC signal, the set signal and the reset signal, and outputs the fail IO number FION<r> to the redundancy IO multiplexer coding section 144.

First, a command processing control method and a command processing circuit for the state diagram according to the present invention will be explained.

Figure 24:
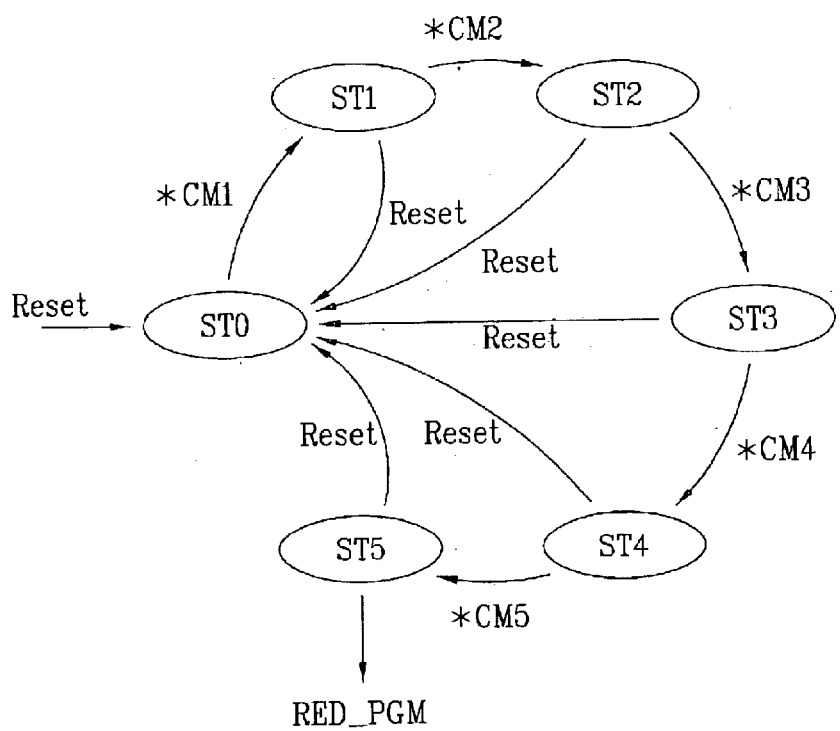
FIG. 24 is a view illustrating the command processing control state of a state diagram generating section.

FIG. 24 is a view illustrating the command processing control state of the state diagram generating section.

In the redundancy programming procedure of the state diagram generating section, the encryption process, i.e., the command process is in a ready state by outputting a program enable signal RED_PGM by combination of n states of ST0, ST1, ST2, . . . , STn−1 and commands of CM1, CM2, CM3, . . . . , CMn.

In the drawing, five states of ST1, ST2, ST3, ST4 and ST5 are exemplified. In case of an initial power on, the present state becomes ST1 by the reset signal, and if the condition of CM1 is satisfied in the ST0 state, the present state becomes ST1. Also, if the condition of CM2 is satisfied in the ST1 state, the present state becomes ST2. However, if the condition of CM2 is not satisfied in the ST1 state, the present state is reset to ST0.

At this time, the state change from ST0 to ST1 or from ST1 to ST2 is triggered by a clock signal CLK.

Also, if the condition of CM5 is satisfied in the ST4 state, the present state becomes ST5, and thus the program enable signal RED_PGM is finally outputted.

Next, the circuit construction for the command process of the state diagram generating section will be explained.

Figure 25:
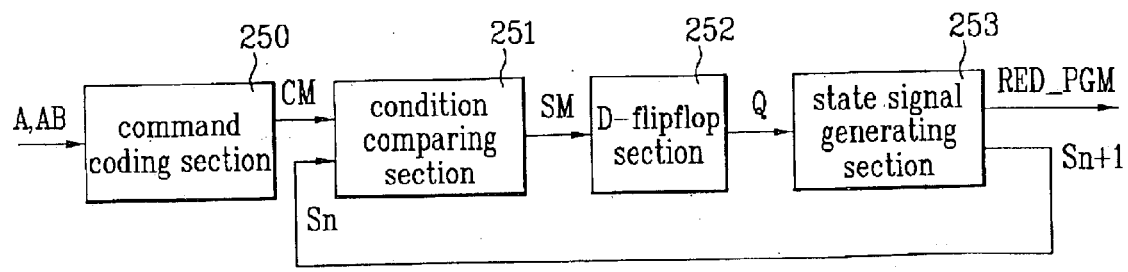
FIG. 25 is a block diagram of a block for the command processing.

FIG. 25 is a block diagram for command processing, and FIGS. 26a to 26d are detailed circuit diagrams of the blocks of FIG. 25.

The block includes a command coding section 250 for processing the first address ADD and outputting a command CM if a first address ADD, which is latched through an address latch, is the same as the input encoded by a user, a condition comparing section 251 for receiving a signal SN for indicating the n-th state STn and the command CM, and outputting an SD signal, a D-type flip-flop section 252 for outputting the SD signal as a Q signal, and a state signal generating section 253 for receiving the Q signal, outputting a signal Sn+1 for indicating a next state STn+1 to the condition comparing section 251, and outputting a program enable signal RED_PGM.

Figure 26A:
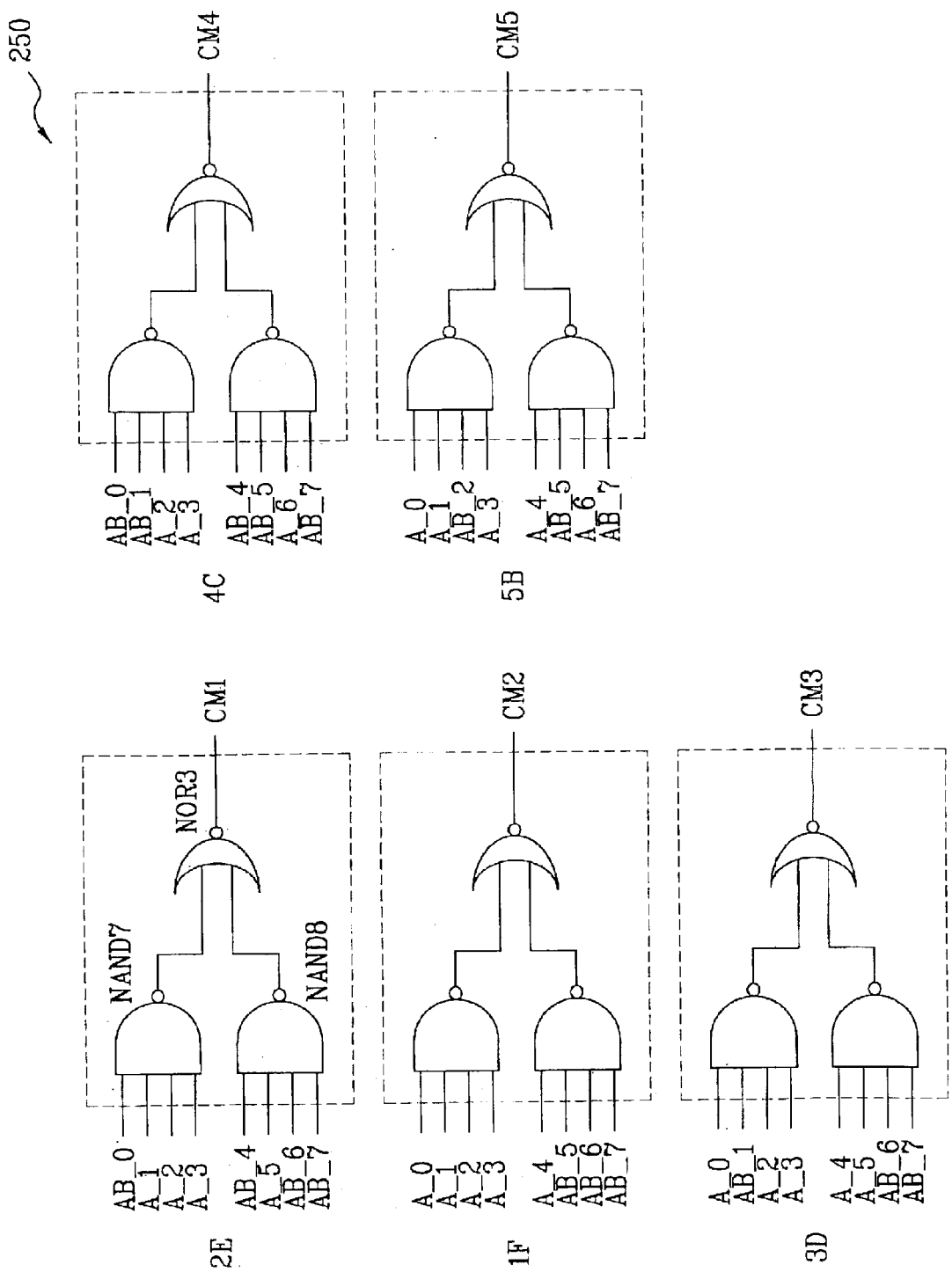
FIGS. 26a to 26d are circuit diagrams of blocks of FIG. 25.
Figure 26B:
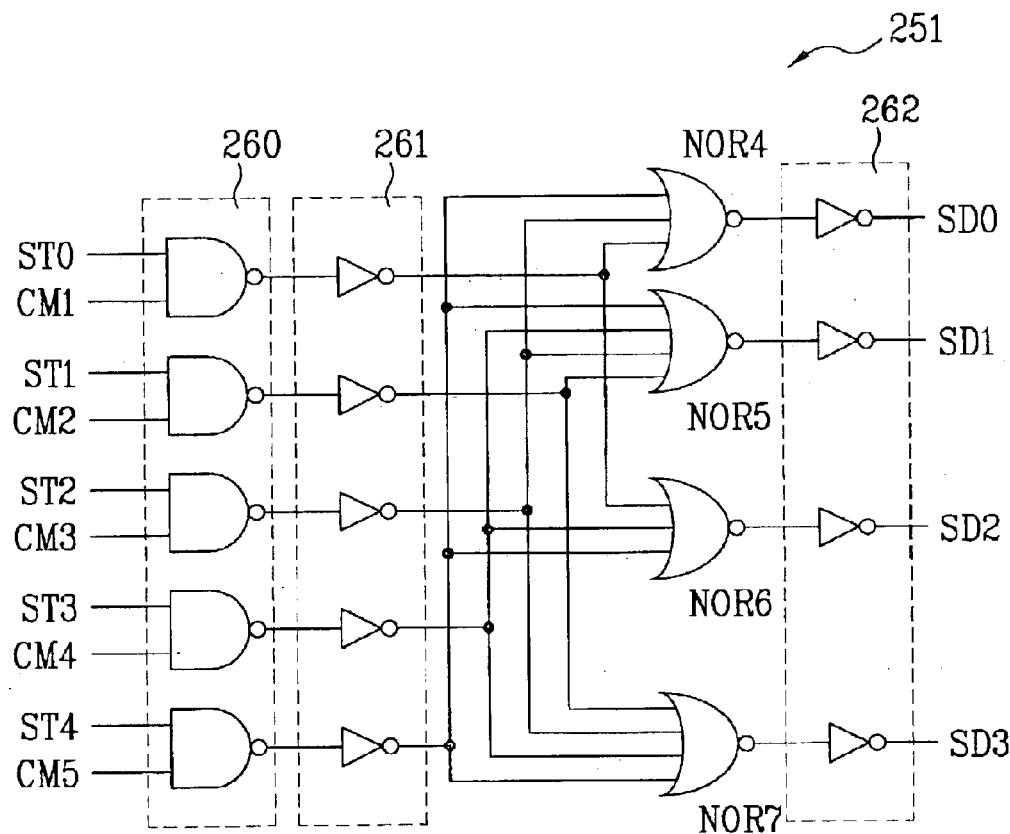
Figure 26C:
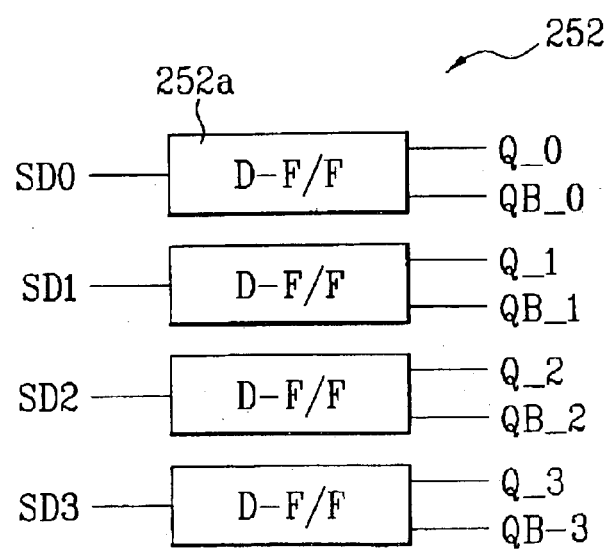
Figure 26D:
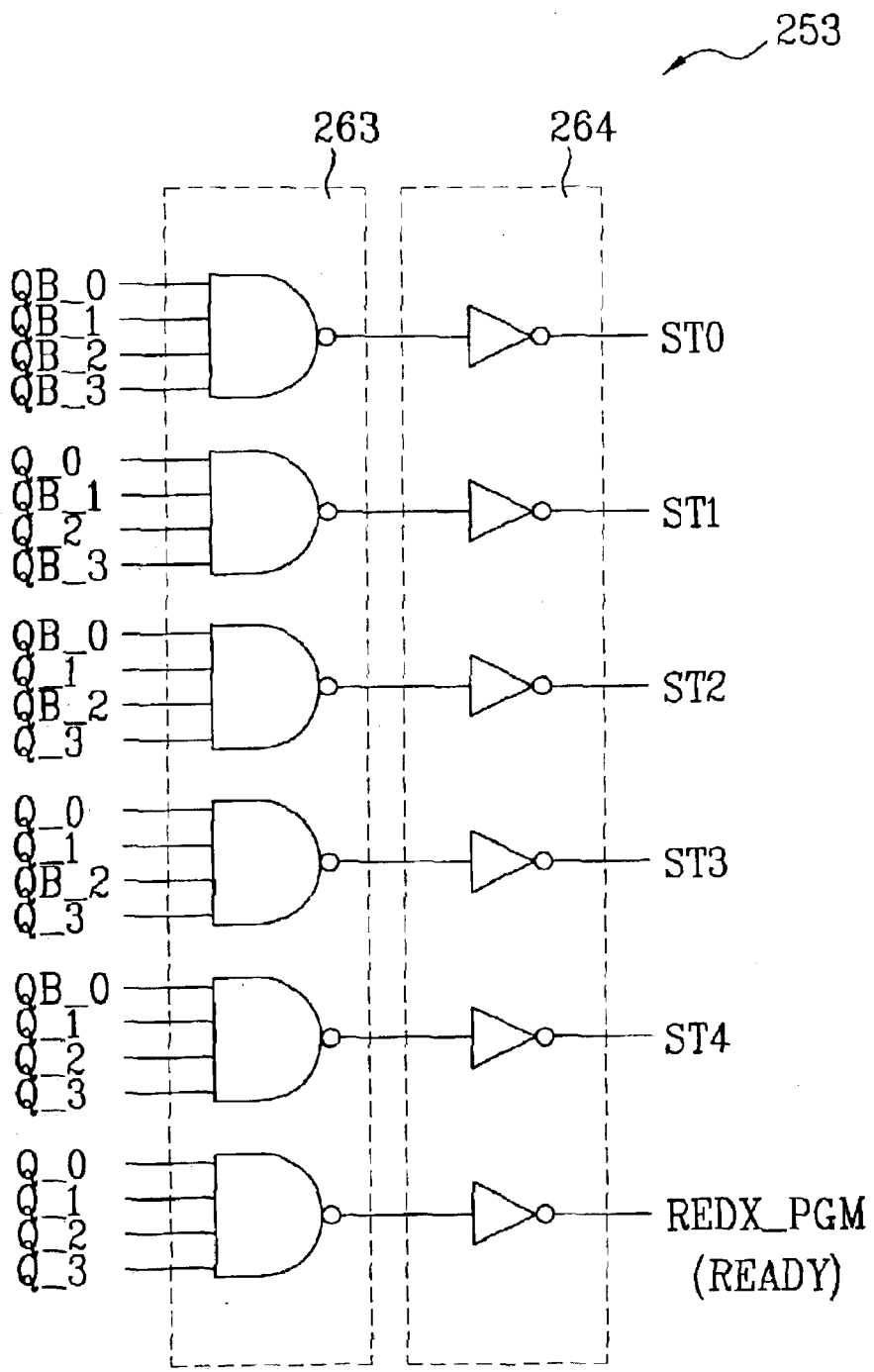

The command coding section 250, as illustrated in FIG. 26a, is configured to output a single command CM for the inputs encoded by a user.

That is, the command coding section 250 includes 5 circuit blocks to output commands CM1~CM5 with respect to the values 2E, 1F, 3D, 4C and 5B encoded by the user.

The above 5 circuit blocks have the same structure, and one of them includes seventh and eighth NAND gates NAND7 and NAND8, each receiving 4 bits of the 8-bit fail input address, and a third NOR gate NOR3 for NOR-gating the output signals of the seventh and the eight NAND gates, and outputting the command CM.

Table 1 illustrates the output of the command CM according to conditions encoded by a user.

The structure of the command coding section 250 of FIG. 26a for the fail address will be explained in detail referring to Table 1.

TABLE 1

| | ADD | | | | | | | OUT |
|---|---|---|---|---|---|---|---|---|
| | A7 | A6 | A5 | A4 | A3 | A2 | A1 | A0 | (CM) |
| 2E | 0 | 0 | 1 | 0 | 1 | 1 | 1 | 0 | CM1 |
| 1F | 0 | 0 | 0 | 1 | 1 | 1 | 1 | 1 | CM2 |
| 3D | 0 | 0 | 1 | 1 | 1 | 1 | 0 | 1 | CM3 |
| 4C | 0 | 1 | 0 | 0 | 1 | 1 | 0 | 0 | CM4 |
| 5B | 0 | 1 | 0 | 1 | 1 | 0 | 1 | 1 | CM5 |

That is, if the address ADD from the address latch is a value which is predetermined in the command coding section 250 by a user, the seventh NAND gate NAND7 performs a NAND-gating of A0~A3 and the eighth NAND gate NAND8 performs a NAND-gating of A4~A8. The third NOR gate NOR3 outputs the command CM by performing a NOR-gating.

If the address ADD is 2E(00101110), the command CM1 is outputted, and if the address ADD is 4C(01001100), a command CM4 is outputted.

Also, the condition comparing section 251 logically processes the command CM and the state signal Sn.

The condition comparing section 251 includes a third NAND gate section 260, a second inverter section 261, fourth to seventh NOR gates NOR4~NOR7, and a third inverter section 262. The third NAND gate section 260 includes NAND gates which perform NAND-gating of the commands CM1~CM5 and the state signals S0~S4. The second inverter section 261 includes first to fifth inverters, which correspond to the NAND gates of the third NAND gate section 260 in a one-to-one manner and invert outputs of the corresponding NAND gates. The fourth NOR gate NOR4 performs a NOR-gating of the outputs of the first, third, and fifth inverters of the second inverter section 261, and the fifth NOR gate NOR5 performs a NOR-gating of the outputs of the second, third, fourth, and fifth inverters of the second inverter section 261. The sixth NOR gate NOR6 performs a NOR-gating of the output of the first, fourth, and fifth inverters of the second inverter section 261, and the seventh NOR gate NOR7 performs a NOR-gating of the outputs of the second, third, fourth, and fifth inverters of the second inverter section 261. The third inverter section 262 includes inverters which correspond to the fourth, fifth, sixth, and seventh NOR gates NOR4, NOR5, NOR6, NOR7 in a one-to-one manner, and invert the outputs of the corresponding NOR gates to output SD0~SD3.

Also, the D-type flip-flop section 252 includes a plurality of D-type flip-flops 252a for receiving the SD0, SD1, SD2, and SD3 signals, respectively, being triggered by a clock signal CLK, and outputting Q_0/QB_0, Q_1/QB_1, Q_2/QB_2, and Q_3/QB_3 signals.

The state signal generating section 253 includes a fourth NAND gate section 263 having a plurality of 4-input NAND gates for receiving Q_0/QB_0, Q_1/QB_1, Q_2/QB_2, and Q_3/QB_3 signals from the D-type flip-flop section 252 as described above, and a fourth inverter section 264 having a plurality of inverters corresponding to NAND gates of the fourth NAND gate section 263 in a one-to-one manner, inverting the output signals of the corresponding NAND gates, and outputting state signals S0~S4 and the program enable signal RED_PGM.

A detailed circuit construction of the D-type flip-flop section 252 will be explained.

Figure 27:
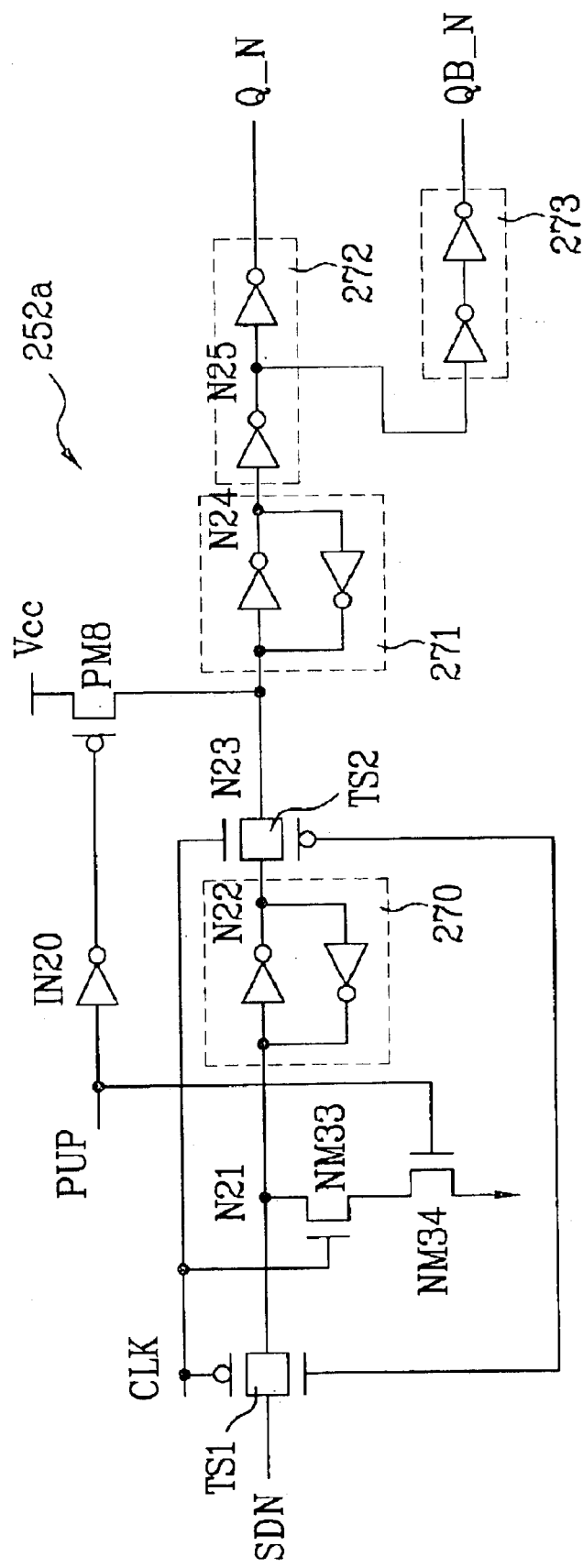
FIG. 27 is a circuit diagram of a D-type flip-flop of FIG. 26c.

FIG. 27 is a detailed circuit diagram of the n-th D-type flip-flop in the D-type flip-flop section 252.

The n-th D-type flip-flop receives the n-th output SDN of the condition comparing section 251, and by triggered by a clock signal CLK, produces Q_N and QB_N.

The structure of the nth D-type flip-flop includes second and third transmission gates TS1, TS2, 33rd and 34th NMOS transistors NM33, NM34, an eighth PMOS transistor PM8, eleventh and twelfth latches 270, 271, a 20th inverter IN20, and third and fourth delay sections 272, 273.

The second transmission gate TS1 transmits the SDN input to a 21st node N21 according to a clock signal CLK and a clock-bar signal CLKB. The 33rd and 34th NMOS transistors NM33, NM34 are serially connected between the 21st node N21 and the end of a grounded voltage Vss. The clock signal CLK and a power-up detecting signal PUP are applied to each gate end.

The eleventh latch 270 temporarily stores the signal of the 21st node N21, inverts it, and outputs to a 22nd node N22. The third transmission gate TS3 outputs the signal of the 22nd node N22 to a 23rd node N23 according to the clock signal CLK and the clock-bar signal CLKB.

The 20th inverter IN20 inverts the power-up detecting signal PUP, and the eighth PMOS transistor PM8 outputs a power voltage Vcc according to the output of the 20th inverter IN20 to the 23rd node N23.

Also, the twelfth latch 271 temporarily stores the signal of the 23rd node N23, inverts it, and outputs to a 24th node N24. The third delay section 272 outputs the signal of the 24th node N24 as Q_N with a predetermined time of delay, and the fourth delay-section 273 outputs the inverted signal of the 24th node N24 as QB_N with a predetermined time of delay.

Here, the second and the third transmission gates TS1, TS2 include an NMOS transistor and a PMOS transistor respectively and both ends of them are connected with each other.

If the clock signal CLK is 'high', the second and the third transmission gates TS1, TS2 are turned on, the SDN signal is outputted through the eleventh and the twelfth latches 270, 271 and the third delay section 272 as a Q_N signal, and the Q_N signal is inverted through the fourth delay section 273 to output a QB_N signal.

If the power-up detecting signal PUP is 'high', the 34th NMOS transistor NM34 and the eighth PMOS transistor PM8 are turned on, the 21st node N21 is 'low', and the 23rd node N23 is 'high' so that the SDN is not transmitted to the Q_N and the QB_N.

That is, the D-type flip-flop 252a is triggered by a clock signal CLK and is normally operated when the power-up detecting signal PUP is 'low'.

Then, the structure of a circuit diagram for the output signal of the state diagram generating section for the redundancy mode operation is illustrated.

The redundancy mode operation of the non-volatile ferroelectric memory device of the present invention can be activated by the output of a clock signal CLK, a set signal, a reset signal, ENW<n>, CPL signal and PREC, FION<r>.

The clock signal CLK, the set signal, the reset signal, ENW<n>, CPL signal can be outputted by activated program enable signal RED_PGM.

Then, there will be described a clock signal generating circuit, which is inputted to the D-type flip-flop and used as a trigger pulse for the generation of a state signal.

Figure 28:
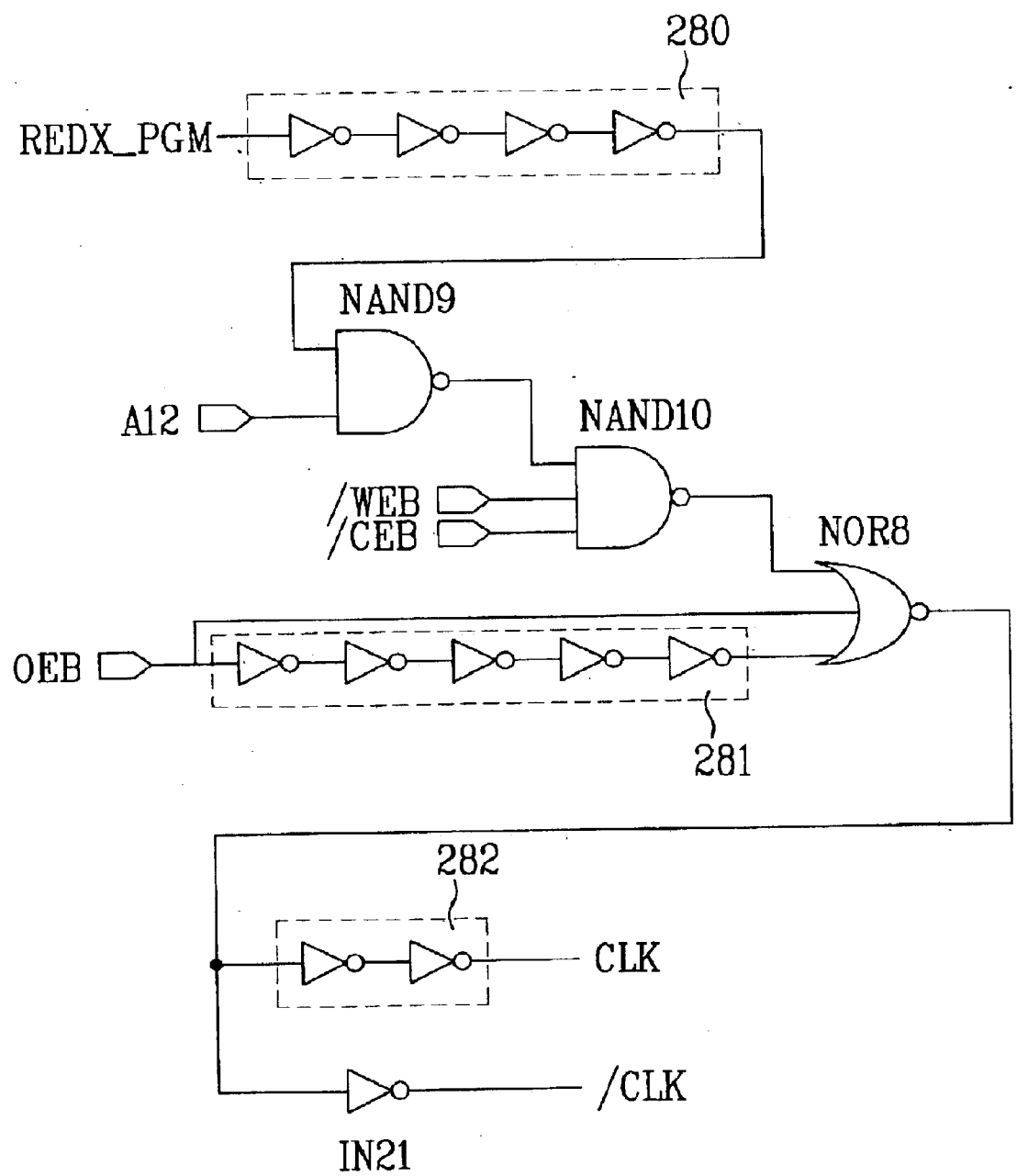
FIG. 28 is a circuit diagram of a clock signal generating block.
Figure 32:
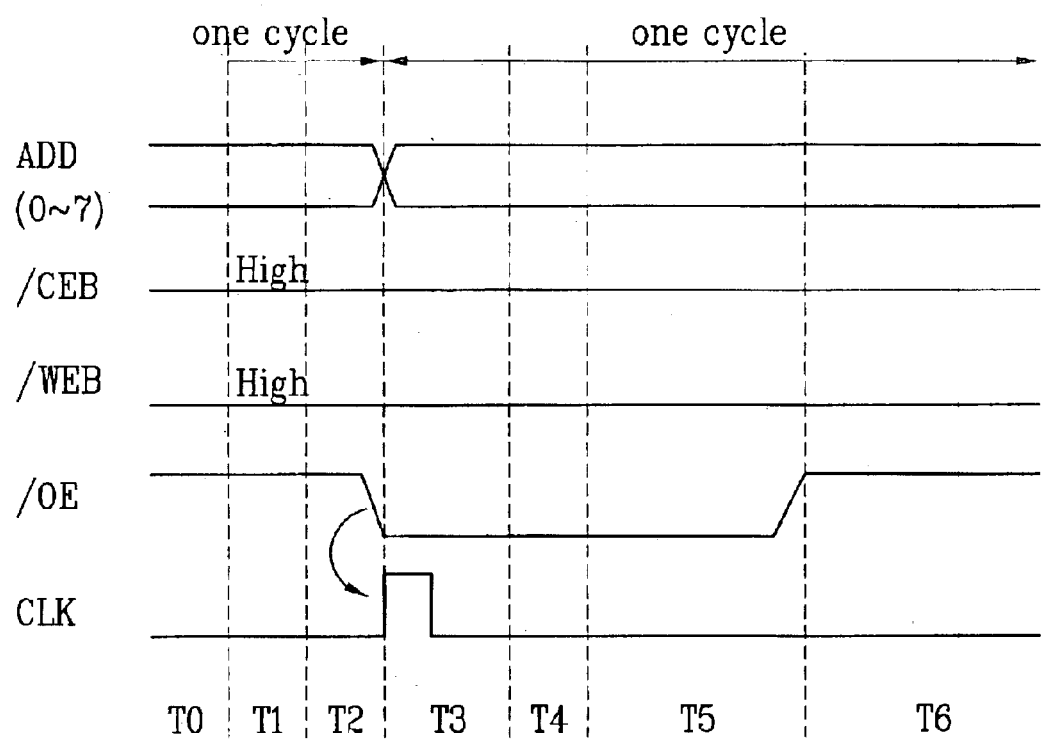
FIG. 32 is a waveform diagram explaining an operation of the circuit of FIG. 28.

FIG. 28 is a detailed circuit for the generation of a clock signal CLK, and FIG. 32 is a waveform diagram of FIG. 28.

The circuit illustrated in FIG. 28 is the one for outputting a clock signal CLK by receiving a program enable signal RED_PGM, and includes a fifth delay section 280, ninth and tenth NAND gates NAND9, NAND10, a first delay/inversion section 281, an eighth NOR gate NOR8, a sixth delay section 282, and a 21st inverter IN21.

The fifth delay section 280 outputs the program enable signal RED_PGM with a predetermined time of delay, and the output of the fifth delay section 280 is inputted into one end of the ninth NAND gate NAND9. When an address A12 is 'high', a 'high' value of signal is inputted to the other end.

The output signal of the ninth NAND gate NAND9 and pad input signals /WEB, /CEB are inputted into the tenth NAND gate NAND10.

Then, the first delay/inversion section 281 delays/inverts a pad input signal OEB and outputs. The eighth NOR gate NOR8 performs a NOR-gating of the output signal of the tenth NAND gate NAND10, the OEB signal, and the output signal of the first delay/inversion section 281.

The sixth delay section 282 delays the output signal of the eighth NOR gate NOR8 for a predetermined time, and outputs as a clock signal CLK. The 21st inverter IN21 inverts the output signal of the NOR gate, and outputs as a clock-bar signal CLKB.

The operation of the circuit structured as above is illustrated in such a manner that, as shown in FIG. 32, if the program enable signal RED_PGM is 'low', the output of the ninth NAND gate NAND9 is 'high' regardless of a value of A12, and if the OEB signal is converted from 'high' level to 'low' level while the /WEB and /CEB are all maintained 'high' level, the pulses of a clock signal CLK is outputted.

Then, if the inverted OEB signal passing through the first delay/inversion section 281 is inputted into the input end of the eighth NOR gate NOR8, the clock signal CLK is toggled.

In addition, if the program enable signal RED_PGM is 'high', and the A12 is 'high', the output of the ninth NAND gate NAND9 is 'low', and the output of the tenth NAND gate NAND10 is 'high' regardless of /WEB, /CEB, and the clock signal CLK is always 'low'.

As described above, the clock signal CLK is used a trigger pulse during the state change in the command processing of the state diagram generating section.

Therefore, if the program enable signal RED_PGM is 'low', it is necessary to generate a clock signal CLK for the proceeding to a next state, but after the program enable signal RED_PGM is enabled into 'high', it is not necessary to proceed to a next state, and therefore, a clock signal is not generated during the corresponding cycle.

Now, the structure of a circuit for selecting one of a plurality of unit redundancy coding sections of the programmable redundancy coding section, and outputting a set signal and a reset signal, which are inputted into a redundancy master cell of the selected redundancy coding section is described.

Figure 29:
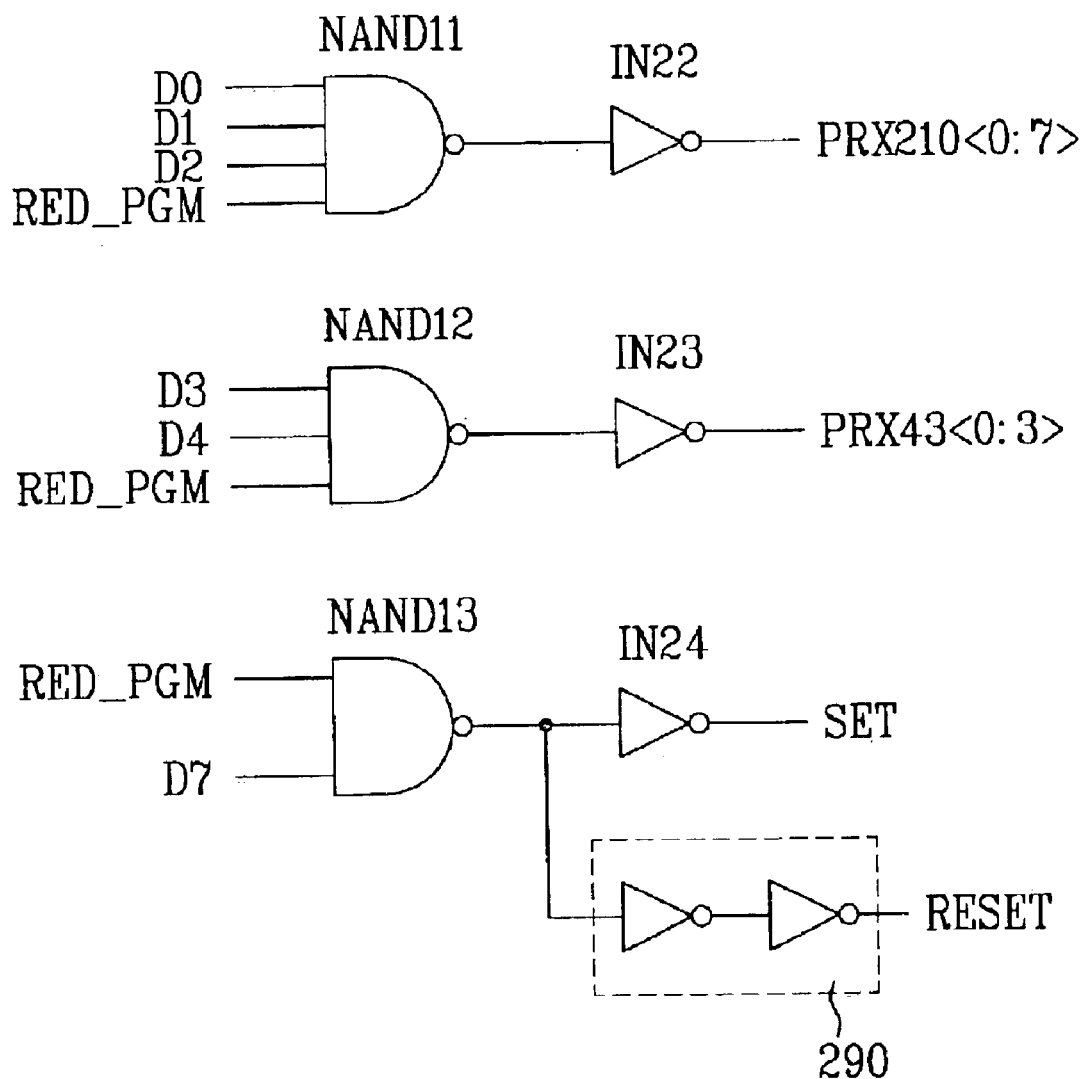
FIG. 29 is a circuit diagram of a circuit for selecting one among 32 unit redundancy coding sections of a redundancy array section and generating a set signal and a reset signal to be inputted to the selected unit redundancy coding section.

The structure of FIG. 29 is a circuit for selecting one of 32 unit redundancy coding sections of the redundancy array section, and producing a set signal and a reset signal to be inputted to the selected unit redundancy coding section.

FIG. 29 illustrates a circuit structure including an eleventh NAND gate NAND11 for receiving and performing a NAND-gating of the redundancy coding cell numbers D0~D4, D7, and the programmable enable signal RED_PGM, a twelfth NAND gate NAND12 for receiving and performing a NAND-gating of D3, D4 and the programmable enable signal RED_PGM, a thirteenth NAND gate NAND13 for receiving and performing a NAND-gating of D7 and the programmable enable signal RED_PGM, 22nd and 23rd inverters for outputting signals PREX<0:7>, PREX<0:3>, respectively, for inverting the output of the eleventh and the twelfth NAND gates NAND11, NAND12, and determining to select one of 8 or 4 unit redundancy coding sections, a 24th inverter IN24 for inverting the output signal of the thirteenth NAND gate NAND13, and outputting a set signal, and a seventh delay section 290 for delaying the output signal of the thirteenth NAND gate NAND13 for a predetermined time, and outputting a reset signal.

The redundancy coding cell number is to indicate one of the redundancy coding cells of the redundancy coding section.

Therefore, when the program enable signal RED_PGM and D7 are 'high' levels, the set signal is outputted as 'high', and the master signal of the redundancy master cell is activated to achieve the redundancy mode operation.

Then, a circuit structure for the output of ENW and CPL signals is described.

Figure 30:
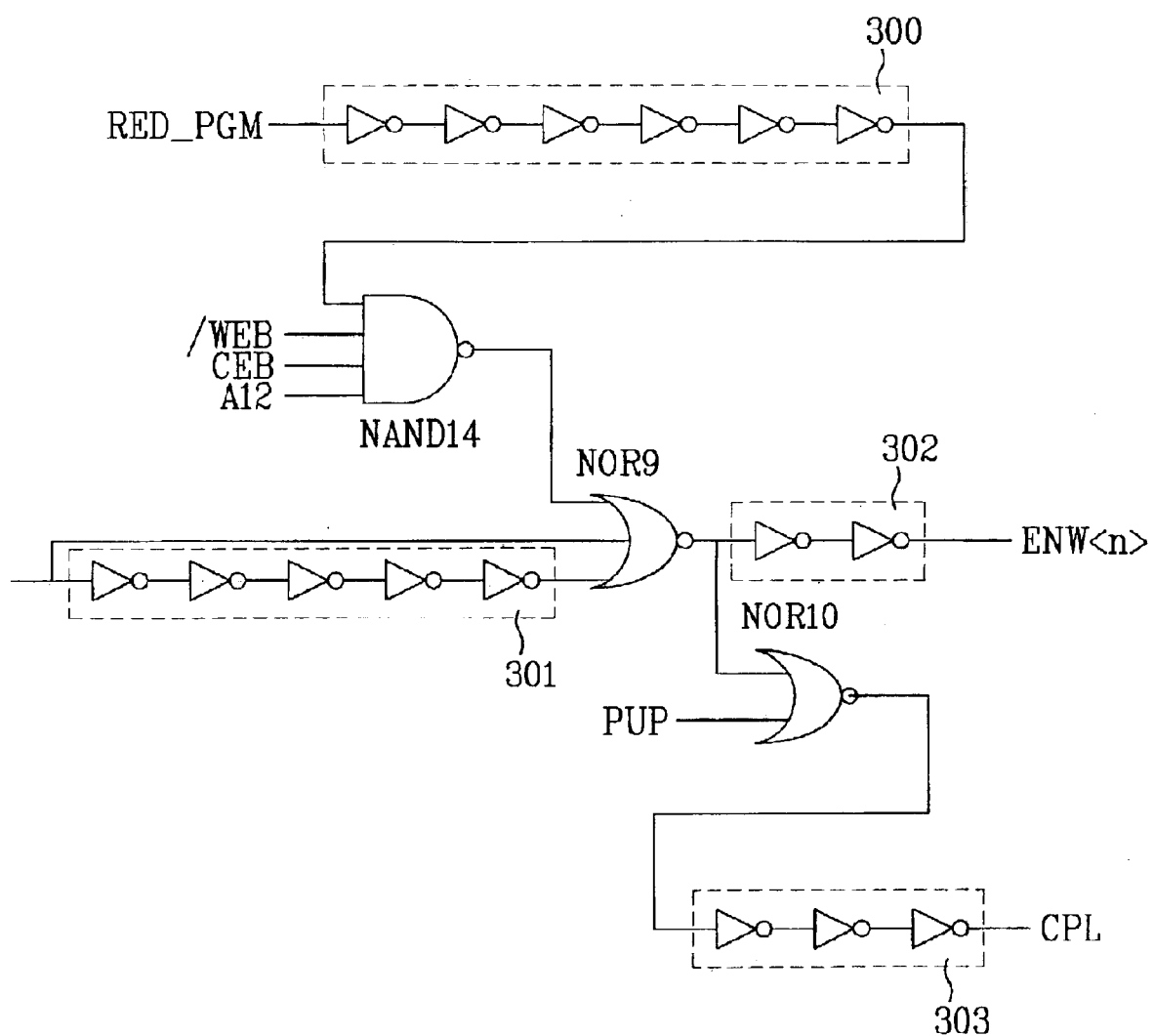
FIG. 30 is a circuit diagram of a block for outputting signals CPL and ENW<n> according to a program enable signal.
Figure 33:
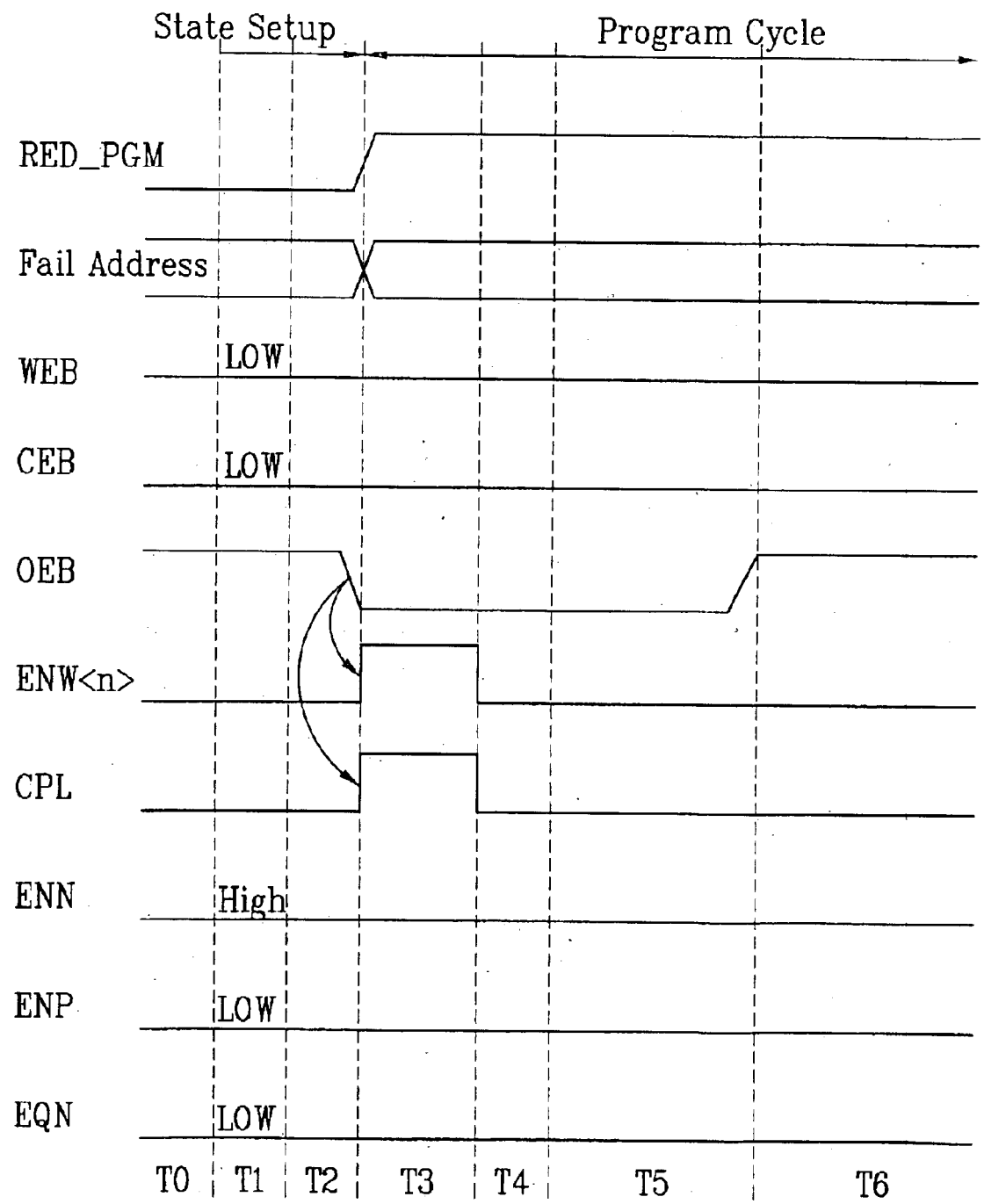
FIG. 33 is a timing diagram explaining an operation of the circuit of FIG. 30.

FIG. 30 is a circuit diagram of outputting a control signal for inputting a redundancy address into the redundancy coding section and writing redundancy IO data into a redundancy cell after the program enable signal (RED_PGM) is outputted, and FIG. 33 is an operation timing view of the circuit illustrated in FIG. 30.

The circuit structure of FIG. 30 includes an eighth delay section 300, a fourteenth NAND gate NAND14, a second delay/inversion section 301, a ninth delay section 302, a third delay/inversion section 303, a ninth NOR gate NOR9, and a tenth NOR gate NOR10.

First, the eighth delay section 300 delays the program enable signal RED_PGM for a predetermined time, and outputs to the input end of the fourteenth NAND gate NAND14. The fourteenth NAND gate NAND14 perform a NAND-gating of the output signal of the eighth delay section 300 and pad signals, /WEB, /CEB, and an address signal A12, and outputs to one end of the ninth NOR gate NOR9.

The ninth NOR gate NOR9 outputs by NOR-gating the output signal of the fourteenth NAND gate NAND14, the pad signal OEB, and the OEB signal inverted through the second delay/inversion section 301. The output of the ninth NOR gate NOR9 is inputted to the input end of the ninth delay section 302 and one end of the tenth NOR gate NOR10.

Then, the ninth delay section 302 delays the output of the ninth NOR gate NOR9 for a predetermined time, and outputs the delayed output as the ENW<n>. The tenth NOR gate NOR10 outputs to the third delay/inversion section 303 by NOR-gating the output of the ninth NOR gate NOR9 and a power-up detecting signal PUP.

Also, the third delay/inversion section 303 delays and inverts the output signal of the tenth NOR gate NOR10 and outputs as a CPL.

Therefore, as shown in FIG. 33, while the program enable signal RED_PGM is 'high', and /WEB, /CEB, A12 are maintained 'high', if the OEB signal is transferred from 'high' to 'low', 'high' level of an ENW<n> signal pulse is outputted. At this time, if the power-up detecting signal PUP is maintained 'low', 'high' level of a CPL signal pulse is outputted.

A fail relieving method of the non-volatile ferroelectric memory device structured above according to first and second embodiments of the present invention will be described.

First, the non-volatile ferroelectric memory device according to the first embodiment of the present invention will now be described.

The operation of the non-volatile ferroelectric memory device can be divided into a power supply mode and a redundancy program mode.

The power supply mode is operated by a power-up mode.

Figure 31:
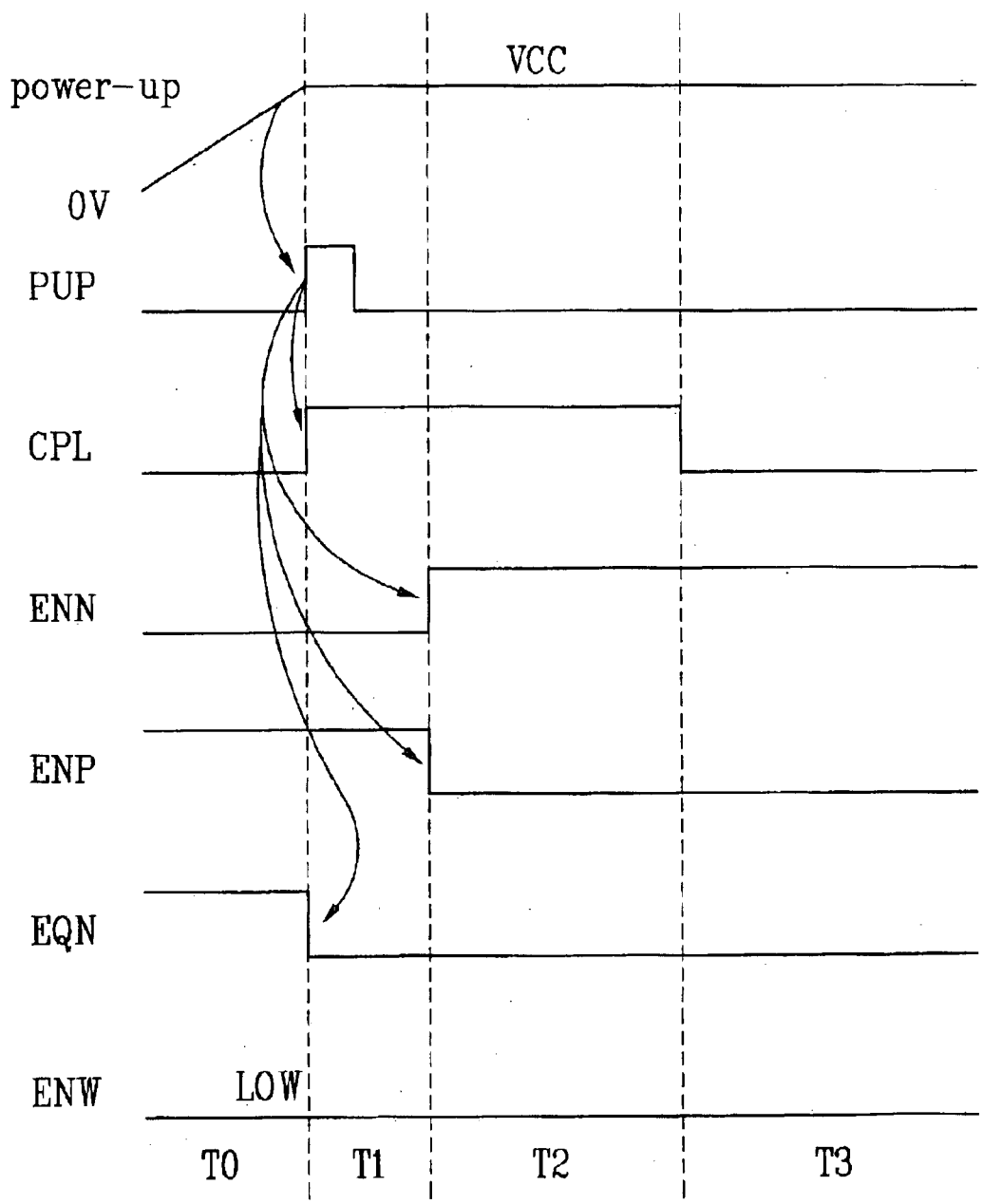
FIG. 31 is a timing diagram explaining an operation of a nonvolatile ferroelectric memory device in a power supply mode.

FIG. 31 is a timing diagram of the operation of the non-volatile ferroelectric memory device in the power supply mode.

That is, the power supply mode is a process for sensing the data stored in a redundancy cell, and operated by the power-up mode.

If the power-up power source reaches a stable level, a power-up detecting pulse PUP is generated, and if the PUP is generated, EQN is transferred from 'high' level to 'low' level to release the equalization, and the CPL is transferred to 'high' level.

Accordingly, the electrons stored in first and second ferroelectric capacitors FC1, FC2 of FIG. 12 generate a voltage difference between the end nodes of the cells by capacitance loads of third and fourth ferroelectric capacitors FC3, FC4, i.e., second and third nodes N2, N3.

In addition, if an enough voltage difference between the second and the third nodes N2, N3 and the sixth and the seventh nodes N6, N7 are generated, ENN and ENP are activated as 'high' level and 'low' level, respectively, to amplify the data of the both ends of the cell.

If the amplification of the data of the both ends of the cell is completed, the destructed 'high' data of the fifth and the sixth ferroelectric capacitors FC5, FC6 is restored through transferring of the CPL with a 'low' level again.

At this time, ENW<n> is inactivated as 'low' level to prevent an outside data from being written.

Then, a method of saving a case that a fail address data is written in the redundancy program mode, i.e. on a non-volatile ferroelectric memory device is described.

As illustrated in FIGS. 25, 26a to 26d, and 27, a state diagram generating section 53 produces 'high' level of a program enable signal RED_PGM for the case that the input address satisfies the all conditions encoded by a user.

Also, one of a plurality of the redundancy coding sections is selected by the circuit of FIG. 29 for inputting the 'high' program enable signal RED_PGM, and 'high' level of a set signal and 'low' level of a reset signal are outputted to the redundancy master cell of the selected redundancy coding section.

In addition, a 'high' level ENW<n> signal and a CPL signal are generated from the circuit of FIG. 30.

That is, if the state diagram generating section satisfies the conditions encoded by a user, 'high' level of a set signal, ENW<n>, CPL are outputted, and 'low' level of a reset signal is outputted.

At this point, ENN is outputted with a state of 'high' level, ENP with a state of 'low', and EQN is outputted with a state of 'low' level continuously.

Then, RPUL<n> and REN<n> signals are outputted through a redundancy master cell 60 for receiving the set signal, the reset signal, common signals ENW<n>, CPL, ENN, ENP and EQN as the output signals of the state diagram generating section 53, and a plurality of redundancy coding cells 61.

At this point, the redundancy master cell 60 and a plurality of redundancy coding cells 61 are operated by receiving 'high' level of the set signal, ENW<n>, ENN, PREC, CPL signals, and 'low' level of the reset signal, ENP, EQN signals.

The redundancy master cell 60 outputs a master signal through the circuit operation of FIG. 12 before outputting the RPUL<n> and REN<n> signals, and the redundancy coding cells 61 encode redundancy cells, which fail are generated, through the circuit operation of FIG. 13.

If a fail address is generated, and new data replaces old data, the fail address information is memorized in the redundancy coding cell 61 of FIGS. 6 and 13, and the redundancy master cell 60 is activated by using FIG. 12.

For example, if a fail address is 'high', ADD is 'high', and ADDB is 'low'.

If the eighth and the ninth NMOS transistors NM8, NM9 are turned on by an ENW<n> signal, 'high' data and 'low' data are stored in the fifth and the sixth ferroelectric capacitors FC5, FC6 respectively.

Then, if a corresponding fail address is inputted after the redundancy coding, a sixth node N6 and ADD are 'high' level to turn on the tenth NMOS transistor NM10 and the twelfth NMOS transistor NM12, and RS1 and RS2 are in a low resistance state that current can flow therethrough.

On the contrary, if an address not a corresponding fail address is inputted, the sixth node N6 indicates 'high', but ADD indicates 'low', and the tenth NMOS transistor NM10 is turned off, and the twelfth NMOS transistor NM12 are turned on so that RS1 and RS2 are in a high resistance state that current cannot flow therethrough.

If a fail address is 'low', ADD is 'low' and ADDB is 'high'.

Then, if ENW<n> is inputted, the eighth and the ninth NMOS transistor NM8, NM9 are turned on, and 'low' and 'high' data are stored in the fifth and the sixth ferroelectric capacitors FC5, FC6, respectively.

If a corresponding fail address is inputted after redundancy coding, the seventh node N7 and ADDB are 'high', and the eleventh and the thirteenth NMOS transistors NM1, NM13 are turned on so that RS1 and RS2 are in a low resistance state that current can flow therethrough.

On the contrary, if an address not a corresponding fail address is inputted, the seventh node N7 is 'high' but ADDB is 'low', and the eleventh NMOS transistor NM11 is turned off, but the thirteenth NMOS transistor NM13 is turned on so that RS1 and RS2 are in a high resistance state that current cannot flow therethrough.

Therefore, a corresponding fail address is encoded.

The output of the master signal is described as above with a reference to the structure of FIG. 12.

As described above, if the input address satisfies the condition encoded by a user, the 'high' level set signal, ENW<n> signal, CPL signal, 'low' level of ENP, ENN, EQN, reset signal are inputted.

Therefore, since the second and the fifteenth NMOS transistors NM2, NM15 are turned on, and the third and the eleventh nodes N3, N11 are 'high' levels, and the sixth, and the nineteenth NMOS transistors NM6, NM19 are turned on, an activated master signal in 'low' level is outputted while a PREC signal is in a 'high' level, i.e. in the active level.

The above operation should be made while a corresponding fail address is effective in one cycle.

Then, a redundancy control section 54b, which receives the RPUL<n>, outputs a DECDIS signal to a free decoder 55, and outputs a REDEN signal to a redundancy WL/PL driver 57.

At this point, the DECDIS signal inactivates a normal free decoder pass, and activates a free decoder pass only, which is available for redundancy.

Then, the REDEN signal is a signal for controlling a redundancy WL/PL driver 57, and outputs an opposite signal to the DECDIS.

After that, the free decoder section 55 outputs PreDEC<n> signal, and a post-decoder section 56, which receives the REDEN and the DEC<n>, outputs a Post DEC<n> signal to a redundancy WL/PL driver 57.

At this point, the PreDEC<n> signal is used to activate the redundancy in the redundancy WL/PL driver 57, and is used to select one of a plurality of rows in the redundancy cell array.

After that, the redundancy WL/PL driver 57, which receives REDEN and Post DEC<n>, selects a redundancy cell that is used for fail safe in a redundancy cell array section 59.

Now, a repair method of the nonvolatile ferroelectric memory device according to a second embodiment of the present invention is described.

If a power-up power source in a power supply mode reaches a stable level, a power-up detecting pulse PUP is generated, and if the PUP is generated, EQN is transferred from 'high' level to 'low' level to release equalization, and the CPL is transferred from 'low' level to 'high' level.

Accordingly, the electrons stored in ninth and tenth ferroelectric capacitors FC9, FC10 of FIG. 21 generate a voltage difference between the end nodes of the cells, i.e., the tenth and the eleventh nodes N10, N11 by capacitance loads of eleventh and twelfth ferroelectric capacitors FC11, FC12.

In addition, the electrons stored in thirteenth and fourteenth ferroelectric capacitors FC13, FC14 of FIG. 22 generate a voltage difference between the end nodes of the cells, i.e., the fourteenth and the fifteenth nodes N14, N15 by capacitance loads of fifteenth and sixteenth ferroelectric capacitors FC15, FC16.

In addition, the electrons stored in seventeenth and eighteenth ferroelectric capacitors FC17, FC18 of FIG. 23 generate a voltage difference between the end nodes of the cells, i.e., the eighteenth and the nineteenth nodes N18, N19 by capacitance loads of nineteenth and twentieth ferroelectric capacitors FC19, FC20.

After that, if an enough voltage difference between the tenth and the eleventh nodes N10, N11, between the fourteenth and the fifteenth nodes N14, N15, and between the eighteenth and the nineteenth nodes N18, N19 are generated, ENN and ENP are activated as 'high' level and 'low' level respectively to amplify the data of the both ends of the cell.

If the amplification of the data of the both ends of the cell is completed, the destructed 'high' data of the thirteenth and the fourteenth ferroelectric capacitors FC13, FC14 is restored through transferring of the CPL with a 'low' level again.

At this time, ENW<n> is inactivated as 'low' level to prevent an outside data from being written.

Now, the method of saving a fail bit in a redundancy program mode, i.e., nonvolatile ferroelectric memory device is described.

The saving of the fail bit is performed through writing of the fail bit in the redundancy cell.

As shown in FIG. 14, FIGS. 26a to 26d, and FIG. 27, the state diagram generating section 53 produces 'high' level of program enable signal RED_PGM in case that the input address satisfies the conditions encoded by a user, and outputs a fail IO number FION<r>.

Then, the state diagram generating section 53 outputs a 'high' level set signal and a 'low' level reset signal as the 'high' program enable signal RED_PGM by the circuit of FIG. 29.

In addition, the state diagram generating section 53 outputs 'high' level of an ENW<n> signal and CPL signal by the circuit of FIG. 33.

At this point, ENN, ENP, EQN are continuously outputted in 'high', 'low', 'low' levels respectively.

That is, the state diagram generating section 53 outputs the 'high' level set signal, ENW<n>, ENN, CPL signals, and the 'low' level reset signal, ENP, EQN signals so that the data is written in the redundancy cell only if an input address satisfies the conditions predetermined by a user.

The redundancy coding section outputs a master signal through a redundancy master cell 160 before outputting a RPUL<n> signal, and connects RS1 and RS2 through a redundancy coding cell 161 in the case that the fail column address stored in the redundancy coding cells and an input address are the same.

In addition, if a fail bit is generated and in the case that old data is replaced with a corresponding fail column address data and a corresponding fail IO data FION<r>, the fail column address information is memorized in the redundancy coding cell of FIGS. 16 and 22, a master cell is activated by using the circuit of FIG. 21, and RIO<q> bus and IO<r> bus are connected by using redundancy IO coding cells of FIG. 23.

In addition, in a normal operation, a RIODIS signal is outputted to a normal IO passing section 146 to connect a MIO<r> bus and an IO<r> bus for a normal operation.

The repair method and the circuit of the nonvolatile ferroelectric memory device of the present invention have effects as follows.

First, a repair operation according to the set-up (encoding) of a user program can be controlled, and thus a redundancy can be replaced or added arbitrarily.

Second, since the redundancy is replaced or added arbitrarily, a fail generated during a memory test can be saved at any time, and it can be efficiently used in an embedded FeRAM, and a single product.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A method of repairing a nonvolatile ferroelectric memory device, comprising the steps of:

storing fail addresses in a plurality of redundancy coding cells of a redundancy coding section composed of a redundancy master cell and the redundancy coding cells, wherein the redundancy master cell and the redundancy coding cell include a ferroelectric capacitor, respectively;

if input addresses satisfy conditions encrypted by a user, activating a master signal through the redundancy master cell by outputting to the redundancy coding section a set signal, a reset signal and a first group of control signals;

if the input addresses correspond to the fail addresses stored in the redundancy coding cells, outputting a second group of control signals by performing a logical operation of the master signal; and outputting a third group of control signals for inactivating normal input/output paths and activating redundancy input/output paths by operation of a redundancy control section which receives the second group of control signals as its inputs.

2. A method of repairing a nonvolatile ferroelectric memory device in a fail row address relieving method, the method comprising the steps of:

storing fail row addresses in a plurality of redundancy coding cells of a redundancy coding section composed of a redundancy master cell and the redundancy coding cells;

if input row addresses satisfy conditions encrypted by a user, activating a master signal through the redundancy master cell by outputting to the redundancy coding section a set signal, a reset signal and first to sixth control signals (ENN, ENP, EQN<, CPL, ENW<n> and PREC);

if the input row addresses correspond to the fail row addresses stored in the redundancy coding cells, outputting seventh and eighth control signals (REN<n< and RPUL<n>) by performing a logical operation of the master signal;

if the input row addresses correspond to the fail row addresses stored in the redundancy coding section, outputting a ninth control signal (DECDIS) for inactivating normal input/output paths and a tenth control signal (REDEN) for activating redundancy input/output paths through a redundancy control section which receives the eighth control signal (RPUL<n>) as its input; and inactivating driving of corresponding main cells of a main cell array section and activating driving of corresponding redundancy cells of a redundancy cell array section by the eighth to tenth control signals (REN<n>, DECDIS and REDEN).

3. The method as claimed in claim 2, wherein storing of the fail row address in the redundancy coding cells is performed by applying the fail row address as the input row address to a redundancy coding section which receives the first to sixth control signals (ENN, ENP, EQN, CPL, ENW<n> and PREC) and the input row address, and includes redundancy master cells and redundancy coding cells having ferroelectric capacitors, respectively.

4. The method as claimed in claim 2, wherein the repair mode operation is performed during a period where the set is kept in a 'high' level state, the reset signal is kept in a 'low' level state, and the sixth control signal (PREC) is kept in a 'high' level state.

5. The method as claimed in claim 2, wherein the repair mode operation, the first control signal (ENN) is kept in a 'high' level state, and the second and third control signals (ENP and EQN) are kept in a 'low' level state.

6. A method of repairing a nonvolatile ferroelectric memory device in a fail column address relieving method, the method comprising the steps of:

storing fail column addresses in a plurality of redundancy coding cells of a redundancy coding section composed of a redundancy master cell and the redundancy coding cells, and storing fail input/output numbers (FION<r>) which indicate input/output lines corresponding to the fail column addresses in redundancy input/output coding cells of a redundancy input/output coding section composed of a ferroelectric capacitor, and the redundancy input/output coding cells;

if input column addresses satisfy conditions programmed by a user, activating a master signal through the redundancy master cell by outputting to the redundancy coding section a set signal, a reset signal and first to sixth control signals (ENN, ENP, EQN<, CPL, ENW<n> and PREC);

if the input column addresses correspond to the fail column addresses stored in the redundancy coding cells, outputting a seventh control signal (RPUL<n>) by performing a logical operation of the master signal;

outputting an eighth control signal (DECDIS) and a redundancy read/write mode control signal (WLRHR) for activating driving of the redundancy cells through a redundancy control section which receives the read/write mode control signal (WLRH) and the seventh control signal (RPUL<n>) as its inputs; and inactivating driving of normal input/output paths by receiving the eighth control signal (DECDIS) and activating driving of redundancy input/output paths corresponding to the inactivated normal input/output paths by receiving the redundancy read/write mode control signal (WLRHR).

7. The method as claimed in claim 6, wherein storing of the fail column address in the redundancy coding cells is performed by applying the fail column address as the input column address to a redundancy coding section which receives the first to sixth control signals (ENN, ENP, EQN, CPL, ENW<n> and PREC) and the input column address, and includes redundancy master cells and redundancy coding cells having ferroelectric capacitors, respectively.

8. The method as claimed in claim 6, wherein storing of the fail input/output (IO) number (FION<r>) in the redundancy IO coding cells is performed by applying the fail IO number (FION<r>) to a redundancy IO coding section which receives the first to sixth control signals (ENN, ENP, EQN, CPL, ENW<n>), and includes a plurality of redundancy IO coding cells.

9. The method as claimed in claim 6, wherein the repair mode operation is performed during a period where the set signal is kept in a 'high' level state, the reset signal is kept in a 'low' level state, and the sixth control signal (PREC) is kept in a 'high' level state.

10. The method as claimed in claim 6, wherein in the repair mode operation, the first control signal ENN is kept in a 'high' level state, and the second and third control signals (ENP and EQN) are kept in a 'low' level state.

11. A circuit for repairing a nonvolatile ferroelectric memory device comprising:

an address latch for maintaining and outputting input row addresses for one period;

a state diagram generating section for outputting first to sixth control signals (ENN, ENP, EQN, ENW<n>, CPL and PREC) for activating a fail relieving operation, a set signal and a reset signal if the input row addresses satisfy conditions encrypted by a user; and a programmable redundancy coding section for activating a master signal by receiving the first to sixth control signals (ENN, ENP, EQN, ENW<n>, CPL and PREC), the set signal and the reset signal, storing fail row address in a plurality of redundancy coding cells, and if the input row addresses correspond to the stored fail row addresses, outputting seventh to tenth control signals (REN<n>, RPUL<n>, DECDIS and RENEN) for inactivating normal data input/output paths and activating data input/output paths which can be used as redundancy paths.

12. The circuit as claimed in claim 11, wherein the state diagram generating section comprises:

a first circuit section for outputting a program enable signal (RED_PGM) if the input address satisfies a condition set by a user;

a clock generating section for receiving the program enable signal (RED_PGM) and first to third pad signals (/WEB, /CEB and OEB), and outputting a clock signal (CLK) for triggering an operation of the first circuit section;

a second circuit section for receiving the program enable signal (RED_PGM) and redundancy numbers (D0, D1, D2, D3, D4, and D7), selecting one among a plurality of redundancy cells of a redundancy array section, and outputting the set signal and the reset signal; and a third circuit section for receiving the program enable signal (RED_PGM) and the first to third pad signals (/WEB, /CEB and OEB), and outputting the fourth and fifth control signals (CPL and ENW<n>).

13. The circuit as claimed in claim 12, wherein the first circuit section is constructed in a manner that it becomes a first state (ST0) by a user's resetting, if a k-th command ($CM_k$) is satisfied in a k-th ($ST_{k-1}$), it is triggered by a clocl signal (CLK) from the clock generating section to be in a (K+1)-th state ($S_k$), and all n commands (CM1~CMn) are satisfied, it outputs the program enable signal (RED_PGM).

14. The circuit as claimed in claim 12, wherein the clock generating section comprises:

a first delay section for delaying for a predetermined time period and outputting the program enable signal (RED_PGM);

a first operation section for NAND-gating an output of the first delay section and an address signal (A12);

a second operation section for NAND-gating an output of the first operation section and the first and second pad signals (/WEB and /CEB);

a first delay inversion section for delaying and inverting the third pad signal (OEB);

a third operation section for NOR-gating the third pad signal (OEB), an output of the first delay inversion section, and an output of the second operation section;

a second delay section for delaying an output of the third operation section and outputting the clock signal (CLK); and an inverter for inverting an output of the seventh operation section and outputting an inverted clock signal (/CLK).

15. The circuit as claimed in claim 12, wherein the second circuit section comprises:

a first operation section composed of a 4-input NAND gate for NAND-gating the redundancy cell numbers (D0, D1 and D2) and the program enable signal (RED_PGM), a 3-input NAND gate for NAND-gating the redundancy numbers (D3 and D4) and the program enable signal (RED_PGM), and a 2-input NAND gate for NAND-gating the redundancy number (D7) and the program enable signal (RED_PGM);

first and second inverters for inverting outputs of the 4-input NAND gate and the 3-input NAND gate of the first operation section, and outputting PREX210<0:7> and PREX34<0:3> for selecting a specified redundancy of the redundancy cell array;

a third inverter for inverting an output of the 2-input NAND gate of the first operation section and outputting the set signal; and a first delay section for delaying the output of the 2-input NAND gate of the eighth operation section for a predetermined time period, and outputting the reset signal.

16. The circuit as claimed in claim 12, wherein the third circuit section comprises:

a first delay section for delaying the program enable signal for a predetermined time;

a first operation section for NAND-gating the first and second pad signal (/WEB and /CEB) and the input address (A12);

a first delay inversion section for delaying and inverting the third pad signal (OEB);

a second operation section for NOR-gating an output of the first operation section, the third pad signal (OEB), and an output of the first delay inversion section;

a second delay section for delaying the output of the first operation section and outputting the fifth control signal (ENW<n>);

a third operation section for NOR-gating an output of the second operation section and a power-up pulse (PUP) that indicates that the power has a stable 'high' level; and a second delay inversion section for delaying and inverting an output of the third operation section and outputting the fourth control signal (CPL).

17. The circuit as claimed in claim 11, wherein the programmable redundancy coding section comprises:

a plurality of unit redundancy coding section for receiving the first to sixth control signals (ENN, ENP, EQN, CPL, ENW<n> and PREC), the set signal and the reset signal, and outputting the seventh control signals (REN<n>) and the eight control signals (RPUL<n>); and a redundancy control section for receiving the eighth control signals (RPUL<n>) from the plurality of unit redundancy coding sections, and outputting the ninth and tenth control signals (DECDIS and REDEN).

18. The circuit as claimed in claim 17, wherein the unit redundancy coding section comprises:

a redundancy master cell for receiving the first to sixth control signals (ENN, ENP, EQN, CPL, ENW<n> and PREC), the set signal and the reset signal, and activating the master signal;

a redundancy coding cell section having a plurality of redundancy coding cells, connected by groups through a plurality of lines, respectively, for receiving the first to fifth control signals, (ENN, ENP, EQN, ENW<n> and CPL) and storing the actual fail row address, and outputting the master signal;

a first operation section for receiving and NOR-gating output signals according to on/off states of the redundancy coding cells;

a first inverter for receiving a signal of the first operation section and outputting the seventh control signal (REN<n>);

a second inverter for receiving a signal of the first inverter and outputting the eighth control signal (RPUL<n>); and PMOS transistors connected to final outputs of the plurality of redundancy coding cells connected through one line.

19. The circuit as claimed in claim 18, wherein the redundancy control section comprises:

a second operation section composed of a plurality of 3-input NOR gates for NOR-gating the eighth control signals (RPUL<n>) from the plurality of unit redundancy coding sections;

a third operation section for NAND-gating output signals of the NOR gates of the second operation section;

a third inverter for receiving an output signal of the third operation section and outputting the ninth control signal (DECDIS); and a fourth inverter for receiving an output signal of the third inverter and outputting the tenth control signal (REDEN).

20. The circuit as claimed in claim 19, further comprising:

a pre-decoder section for receiving the seventh and ninth control signals (REN<n> and DECDIS), activating only paths that can be used as the redundancy, and outputting eleventh control signals (PreDEC<n>);

a post-decoder section for receiving the activated eleventh control signals (PreDEC<n>) and outputting activated post-decoder signals (PostDEC<n>);

a redundancy word line/plate line driver for receiving the tenth control signal (REDEN) and the post-decoder signals (PostDEC<n>) and activating corresponding redundancy word lines/plate lines; and a redundancy cell array section having a plurality of redundancy cells for being activated by an activation signal from the redundancy word line/plate line driver.

21. The circuit as claimed in claim 20, wherein the pre-decoder section comprises a plurality of pre-decoders, and wherein each pre-decoder comprises:

a fourth operation section composed of a plurality of operators for receiving and NAND-gating the input row addresses and the ninth control signal (DECDIS);

a fifth operation section composed of a plurality of operators for receiving and NAND-gating signals of the respective operators of the fourth operation section and the seventh control signals (REN<n>); and a plurality of delay sections U0~Un for delaying/outputting output signals of the respective operators of the fifth operation section.

22. The circuit as claimed in claim 11, wherein the redundancy coding cell comprises:

a PMOS transistor (PM2) for receiving the second control signal (ENP) and transferring a power supply voltage (Vcc) to a first node (N5);

a first latch one node of which is connected to the first node (N5) and the other node of which is connected to second and third nodes (N6 and N7);

first and second NMOS switches (S3 and S4) for receiving an equalizer signal (EQN) and applying a ground voltage (Vss) to the second and third nodes N6 and N7, respectively;

a first NMOS transistor (NM8) a gate of which the fourth control signal (ENW<n>) is inputted to, one terminal of which a signal of the second node N6 is transferred to, and the other terminal of which the input row address ADD is applied to;

a second NMOS transistor (NM9) a gate of which the the fourth control signal (ENW<n>) is inputted to, one terminal of which a signal of the third node (N7) is transferred to, and the other terminal of which the inverted input row address (ADDB) is applied to;

third and fourth NMOS transistors (NM10 and NM11) which are determined to be turned on/off according to the input row addresses (ADD) and (ADDB);

a fifth NMOS transistor (NM14) for receiving an NMOS enable signal (ENN) and transferring the ground voltage (Vss) to the fourth node (N8);

a second latch one node of which is connected to the fourth node (N8) and the other node of which is connected to the second and third nodes (N6 and N7);

a first ferroelectric capacitor (FC5) connected between an input node of the fifth control signal (CPL) and the second node (N6);

a second ferroelectric capacitor (FC6) connected between the input node of the fifth control signal (CPL) and the third node (N7);

a third ferroelectric capacitor (FC7) connected between the second node (N6) and the terminal of the ground voltage (Vss);

a fourth ferroelectric capacitor (FC8) connected between the third node (N7) and the terminal of the round voltage (Vss); and sixth and fifth NMOS transistors (NM13 and NM14) which are determined to be turned on/off by the control of signals of the second node (N6) and the third node (N7).

23. A circuit for repairing a nonvolatile ferroelectric memory device comprising:

an address latch for maintaining and outputting input column addresses for one period;

a state diagram generating section for generating first to sixth control signals (ENN, ENP, EQN, CPL, ENW<n> and PREC) for activating a fail relieving operation, a set signal, a reset signal and pulses of fail input/output (IO) numbers (FION<r>) if the input column addresses satisfy conditions encrypted by a user;

a programmable redundancy coding section for receiving an eighth control signal (WLHR) for controlling an operation of a main amplifier, the first to sixth control signals (ENN, ENP, EQN, CPL, ENW<n> and PREC), the set signal and the reset signal, and outputting a seventh control signal (RPUL<n>), a ninth control signal (WLRHR) for controlling an operation of a redundancy amplifier, and a tenth control signal (RIODIS) for controlling an input/output for a normal operation;

a redundancy IO multiplexer coding section for storing the first to fifth control signals (ENN, ENP, EQN, CPL and ENW<n>) and fail IO numbers (FION<r>), and connecting data input/output to main input/output (MIO<r>) or redundancy input/output (RIO<q>) under the control of the seventh control signal (RPUL<n>); and a normal IO path section for receiving the tenth control signal (RIODIS) and connecting the data input/output to the main input/output (MIO<r>).

24. The circuit as claimed in claim 23, wherein the state diagram generating section comprises:
- a first circuit section for outputting a program enable signal (RED_PGM) if the input address satisfies a condition set by a user;
- a clock generating section for receiving the program enable signal (RED_PGM) and first to third pad signals (/WEB, /CEB and OEB), and outputting a clock signal (CLK) for triggering an operation of the first circuit section;
- a second circuit section for receiving the program enable signal (RED_PGM) and redundancy numbers (D0, D1, D2, D3, D4 and D7), selecting one among a plurality of redundancy cells of a redundancy array section, and outputting the set signal and the reset signal; and
- a third circuit section for receiving the program enable signal (RED_PGM) and the first to third pad signals (/WEB, /CEB and OEB), and outputting the fourth and fifth control signals (CPL and ENW<n>).

25. The circuit as claimed in claim 24, wherein the first circuit section in constructed in a manner that it becomes a first state (ST0) by a user'resetting, if a k-th command ($CM_k$) is satisfied in a k-th state ($ST_{k-1}$), it is triggered by a clock signal (CLK) from the clock generating section to be in a (K+1)-th state ($S_k$), and all n commands (CM1~CMn) are satisfied, it outputs the program enable signal (RED_PGM).

26. The circuit as claimed in claim 24, wherein the clock generating section comprises:
- a first delay section for delaying for a predetermined time period and outputting the program enable signal (RED_PGM);
- a first operation section for NAND-gating an output of the first delay section and an address signal (A12);
- a second operation section for NAND-gating an output of the first operation section and the first and second pad signals (/WEB, and /CEB);
- a second delay inversion section for delaying and inverting the third pad signal (OEB);
- a third operation section for NOR-gating the third pad signal (OEB), an output of the second delay inversion section, and an output of the second operation section;
- a second delay section for delaying an output of the third operation section and outputting the clock signal (CLK); and
- an inverter for inverting an output of the third operation section and outputting an inverted clock signal (/CLK).

27. The circuit as claimed in claim 24, wherein the second circuit section comprises:
- a first operation section composed of a 4-input NAND gate for NAND-gating the redundancy cell numbers (D0, D1 and D2) and the program enable signal (RED_PGM), a 3-input NAND gate for NAND-gating the redundancy numbers (D3 and D4) and the program enable signal (RED_PGM), and a 2-input NAND gate for NAND-gating the redundancy number (D7) and the program enable signal (RED_PGM);
- first and second inverters for inverting outputs of the 4-input NAND gate and the 3-input NAND gate of the first operation section, and outputting PREX210<0:7> and PREX34<0:3> for selecting a specified redundancy of the redundancy cell array;
- a third inverter for inverting an output of the 2-input NAND gate of the first operation section and outputting the set signal; and
- a delay section for delaying the output of the 2-input NAND gate of the first operation section for a predetermined time period, and outputting the reset signal.

28. The circuit as claimed in claim 24, wherein the third circuit section comprises:
- a first delay section for delaying the program enable signal for a predetermined time;
- a first operation section for NAND-gating the first and second pad signals (/WEB and /CEB) and the input address (A12);
- a first delay inversion section for delaying and inverting the third pad signal (OEB);
- a second operation section for NOR-gating an output of the first operation section, the third pad signal (OEB), and an output of the first delay inversion section;
- a second delay section for delaying the output of the second operation section and outputting the fifth control signal (ENW<n>);
- an third operation section for NOR-gating an output of the second operation section and a power-up pulse (PUP) that indicateds that the power has a stable 'high' level; and
- a second delay inversion section for delaying and inverting an output of the third operation section and outputting the fourth control signal (CPL).

29. The circuit as claimed in claim 23, wherein the programmable redundancy coding section comprises:
- a plurality of unit redundancy coding sections for receiving the first to sixth control signals (ENN, ENP, EQN, CPL, ENW<n> and PREC), the set signal and the reset signal, and outputting the seventh control signals (RPUL<n>); and
- a redundancy control section for receiving the seventh control signals (RPUL<n>) from the plurality of unit redundancy coding sections and the eighth control signal (WLRH), and outputting the ninth and tenth control signals (WLRHR and RIODIS).

30. The circuit as claimed in claim 23, wherein the redundancy input/output (IO) multiplexer coding section comprises:
- a first inverter for inverting the seventh control signal (RPUL<n>) and outputting an RPULB<n> signal; and
- a plurality of redundancy IO coding cells for receiving the first to sixth control signals (ENN, ENP, EQN, CPL, ENW<n> and PREC), the seventh control signal (RPUL<n>), the RPULB<n> signal, the fail IO number FION<r>, and selectively connecting them to a main IO bus (MIO<r>) or a redundancy IO bus (RIO<q>).

31. The circuit as claimed in claim 30, wherein the redundancy IO coding cell comprises:
- a first PMOS transistor (PM5) for receiving the second control signal (ENP) and transferring the power supply voltage (Vcc) to a first node (N17);
- a first latch one node of which is connected to the first node (N17) and the other node of which is connected to second and third nodes (N18 and N19);
- first and second NMOS switches (S5 and S6) for receiving the third control signal (EQN) and applying a ground voltage (Vss) to the second and third nodes (N18 and N19), respectively;
- a first NMOS transistor (NM28) a gate of which the fifth control signal (ENW<n>) is inputted to, one terminal of which a signal of the second node (N18) is transferred to, and the other terminal of which the fail IO number (FION<r>) is inputted to, a second NMOS transistor (NM29) a gate of which the fifth control signal (ENW<n>) is inputted to, one terminal of which a signal of the third node (N19) is transferred to, and the other terminal of which the fail IO number (FIONB<r>) is inputted to, a third NMOS transistor (NM30) for receiving the first control signal (ENN) and transferring the ground voltage (Vss) to the fourth node (N20), a second latch one node of which is connected to the fourth node (N20) and the other node of which is connected to the second and third nodes (N18 and N19);

a first ferroelectric capacitor (FC17) connected between an input terminal of the fourth control signal (CPL) and the second node (N18);

an second ferroelectric capacitor (FC18) connected between the input terminal of the fourth control signal (CPL) and the third node (N19);

a third ferroelectric capacitor (FC19) connected between the second node (N18) and the terminal of the ground voltage (Vss);

a fourth ferroelectric capacitor (FC20) connected between the third node (N19) and the terminal of the ground voltage (Vss);

a second PMOS transistor (PM6) and a fourth NMOS transistor (NM31) which are determined to be turned on/off by a signal of the second node (N18);

a third PMOS transistor (PM7) and a fifth NMOS transistor (NM32) which are determined to be turned on/off by a signal of the third node (N19); and a transmission gate for receiving the seventh control signal (RPUL<n>) and the (RPULB<n>) signal and connecting one of the main IO bus (MIO<r>) and the redundancy IO bus (RIO<q>) with the data IO bus (IO<r>).

32. The circuit as claimed in claim 30, wherein the unit redundancy coding section comprises:

a redundancy master cell for receiving the first to sixth control signals (ENN, ENP, EQN, CPL, ENW<n> and PREC), the set signal and the reset signal, and activating the master signal;

a redundancy coding cell section having a plurality of redundancy coding cells, connected by groups through a plurality of lines, respectively, for receiving the first to fifth control signals (ENN, ENP, EQN, ENW<n> and CPL) and storing the actual fail column address, and outputting the master signal;

a first operation section for receiving and NOR-gating output signals according to on/off states of the redundancy coding cells;

a second inverter for inverting a signal of the first operation section;

a third inverter for receiving a signal of the first inverter and outputting the seventh control signal (RPUL<n>); and PMOS transistors connected to final output terminals of the plurality of redundancy coding cells connected through one line.

33. The circuit as claimed in claim 32, wherein the redundancy control section comprises:

a second operation section composed of a plurality of 3-input NOR gates for NOR-gating the seventh control signals (RPUL<n>) from the plurality of unit redundancy coding sections;

a third operation section for NAND-gating output signals of the operators of the second operation section and the eighth control signal (WLRH);

a fourth inverter for inverting an output signal of the third operation section and outputting the ninth control signal (WLRHR<q>); and a fourth operation section for NAND-gating output signals of all the operators of the second operation section; and a fifth inverter for inverting an output signal of the fourth operation section and outputting the tenth control signal (RIODIS).

34. The circuit as claimed in claim 32, wherein the redundancy coding cell comprises:

a first PMOS transistor (PM4) for receiving the second control signal (ENP) and transferring the power supply voltage (Vcc) to a first node (N13);

a first latch one node of which is connected to the first node (N13) and the other node of which is connected to second and third nodes (N14 and N15);

first and second NMOS switches (S7 and S8) for receiving the third control signal (EQN) and applying a ground voltage (Vss) to the second and third nodes (N14 and N15), respectively;

a first NMOS transistor (NM21) a gate of which the fifth control signal (ENW<n>) is inputted to, one terminal of which a signal of the second node (N14) is transferred to, and the other terminal of which the input row address (ADD) is applied to;

a second NMOS transistor (NM22) a gate of which the fifth control signal (ENW<n>) is inputted to, one terminal of which a signal of the third node (N15) is transferred to, and the other terminal of which the inverted input row address (ADDB) is applied to;

third and fourth NMOS transistors (NM24 and NM26) which are determined to be turned on/off according to the input row addresses (ADD and ADDB);

a fifth NMOS transistor (NM23) for receiving the first control signal (ENN) and transferring the ground voltage (Vss) to the fourth node (N16);

an second latch one node of which is connected to the fourth node (N16) and the other node of which is connected to the second and third nodes (N14 and N15);

a first ferroelectric capacitor (FC13) connected between an input node of the fourth control signal (CPL) and the second node (N14);

a second ferroelectric capacitor (FC14) connected between the input terminal of the fourth control signal (CPL) and the third node (N15);

a third ferroelectric capacitor (FC15) connected between the second node (N14) and the terminal of the ground voltage (Vss);

a fourth ferroelectric capacitor (FC16) connected between the third node (N15) and the terminal of the ground voltage (Vss); and fifth and sixth NMOS transistors (NM25 and NM27) which are determined to be turned on/off under the control of signals of the second node (N14) and the third node (N15).

* * * * *